(12) United States Patent
Aichinger et al.

(10) Patent No.: US 10,700,182 B2
(45) Date of Patent: Jun. 30, 2020

(54) SEMICONDUCTOR DEVICE WITH TRANSISTOR CELLS AND A DRIFT STRUCTURE AND METHOD OF MANUFACTURING

(71) Applicant: Infineon Technologies AG, Neubiberg (DE)

(72) Inventors: Thomas Aichinger, Faak am See (AT); Wolfgang Bergner, Klagenfurt (AT); Romain Esteve, Munich (DE); Daniel Kueck, Villach (AT); Dethard Peters, Hoechstadt (DE); Ralf Siemieniec, Villach (AT); Bernd Zippelius, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 228 days.

(21) Appl. No.: 15/979,050

(22) Filed: May 14, 2018

(65) Prior Publication Data
US 2018/0331204 A1 Nov. 15, 2018

(30) Foreign Application Priority Data
May 15, 2017 (DE) .................. 10 2017 110 508

(51) Int. Cl.
| | | |
|---|---|---|
| G06F 30/398 | (2020.01) | |
| H01L 29/66 | (2006.01) | |
| H01L 29/739 | (2006.01) | |
| H01L 27/02 | (2006.01) | |
| H01L 29/16 | (2006.01) | |

(Continued)

(52) U.S. Cl.
CPC ...... H01L 29/66734 (2013.01); G06F 30/398 (2020.01); H01L 27/0207 (2013.01); H01L 29/1608 (2013.01); H01L 29/7391 (2013.01); H01L 29/7813 (2013.01); H01L 22/14 (2013.01); H01L 29/861 (2013.01)

(58) Field of Classification Search
CPC .......... H01L 29/66734; H01L 27/0207; G06F 30/398
USPC ....................................... 716/110
See application file for complete search history.

(56) References Cited

U.S. PATENT DOCUMENTS

| | | |
|---|---|---|
| 8,637,922 B1 | 1/2014 | Siemieniec et al. |
| 9,543,386 B2 | 1/2017 | Siemieniec et al. |

(Continued)

FOREIGN PATENT DOCUMENTS

DE       102012211221 A1     1/2013

OTHER PUBLICATIONS

Maranowski, Michelle M. et al., "Time-Dependent-Dielectric-Breakdown Measurements of Thermal Oxides on N-Type 6H-SiC", IEEE Transactions on Electron Devices, vol. 46, No. 3, Mar. 1999, pp. 520-524.

*Primary Examiner* — Suresh Memula
(74) *Attorney, Agent, or Firm* — Murphy, Bilak & Homiller, PLLC

(57) ABSTRACT

By using at least one of a processor device and model transistor cells, a set of design parameters for at least one of a transistor cell and a drift structure of a wide band-gap semiconductor device is determined, wherein an on state failure-in-time rate and an off state failure-in-time rate of a gate dielectric of the transistor cell are within a same order of magnitude for a predefined on-state gate-to-source voltage, a predefined off-state gate-to-source voltage, and a predefined off-state drain-to-source voltage.

26 Claims, 13 Drawing Sheets

(51) Int. Cl.
*H01L 29/78* (2006.01)
*H01L 29/861* (2006.01)
*H01L 21/66* (2006.01)

(56) References Cited

U.S. PATENT DOCUMENTS

2011/0254010 A1* 10/2011 Zhang ................. H01L 29/0623
257/66
2019/0311903 A1* 10/2019 Aichinger ......... H01L 29/66068

* cited by examiner

SEMICONDUCTOR DEVICE WITH TRANSISTOR CELLS AND A DRIFT STRUCTURE AND METHOD OF MANUFACTURING

BACKGROUND

Some semiconductor materials such as silicon carbide (SiC) show significantly higher dielectric breakdown field strength than silicon such that the extension of a drift zone along the on-state current direction can be made smaller than for comparative silicon devices. For example, vertical power semiconductor devices with a load current flow between a first surface at the front side and an opposite second surface of a semiconductor body from semiconductor materials with high dielectric breakdown field strength can be made to have a significantly thinner drift zone and/or a higher doping concentration in the drift zone such that they can combine very high breakdown voltages of more than 600 V with lower on-state resistance than comparative devices based on silicon. The high breakdown voltage also results in that a stress the gate dielectric in a SiC-MOSFET (silicon carbide metal oxide semiconductor field effect transistor) is exposed to differs from the stress in the gate dielectric of comparative silicon devices.

It is desirable to improve power semiconductor devices from semiconductor materials with high dielectric breakdown field strength in view of gate dielectric reliability and on-state resistance.

SUMMARY

The present disclosure relates to a method of manufacturing a wide band-gap semiconductor device. By using at least one of a processor device and model transistor cells, a set of design parameters for at least one of a transistor cell and a drift structure of the wide band-gap semiconductor device is determined, wherein an on state failure-in-time rate and an off state failure-in-time rate of a gate dielectric of the transistor cell are within a same order of magnitude for a predefined on-state gate-to-source voltage, a predefined off-state gate-to-source voltage, and a predefined off-state drain-to-source voltage.

The present disclosure also relates a semiconductor device that includes a gate structure comprising a gate dielectric that separates a gate electrode from a semiconductor body. The semiconductor device further includes a drift structure that includes a drift zone and a connection portion directly adjoining to a drain-side portion of the gate dielectric. Design parameters of the connection portion, the drift zone, the gate structure and the gate dielectric are selected such that an on state failure-in-time rate of the gate dielectric and an off state failure-in-time rate of the gate dielectric are within a same order of magnitude.

The present disclosure further concerns an electronic circuit that includes a gate driver circuit and a semiconductor device. The gate driver circuit is configured to output a gate signal with an on-state gate-to-source voltage and an off-state gate-to-source voltage at an output terminal. The semiconductor device includes a gate terminal electrically coupled to the output terminal of the gate driver circuit. The semiconductor device includes a gate structure with a gate dielectric separating a gate electrode from a semiconductor body. The gate electrode is electrically connected to the gate terminal. A drift structure includes a drift zone and a connection portion that directly adjoins to a drain-side portion of the gate dielectric. Design parameters of the connection portion, the drift zone, the gate structure and the gate dielectric are selected such that an on state failure-in-time rate of the gate dielectric and an off state failure-in-time rate of the gate dielectric are within a same order of magnitude.

In addition, the present disclosure concerns a method of designing a semiconductor device. By using at least one of a processor device and model transistor cells, a set of design parameters for a transistor cell and a drift structure is determined, wherein an on state failure-in-time rate and an off state failure-in-time rate of a gate dielectric of the transistor cell are within a same order of magnitude for a predefined on-state gate-to-source voltage, a predefined off-state gate-to-source voltage, and a predefined off-state drain-to-source voltage.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or heavily doped semiconductor material. The term "electrically coupled" includes that one or more intervening element(s) adapted for signal transmission may be between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
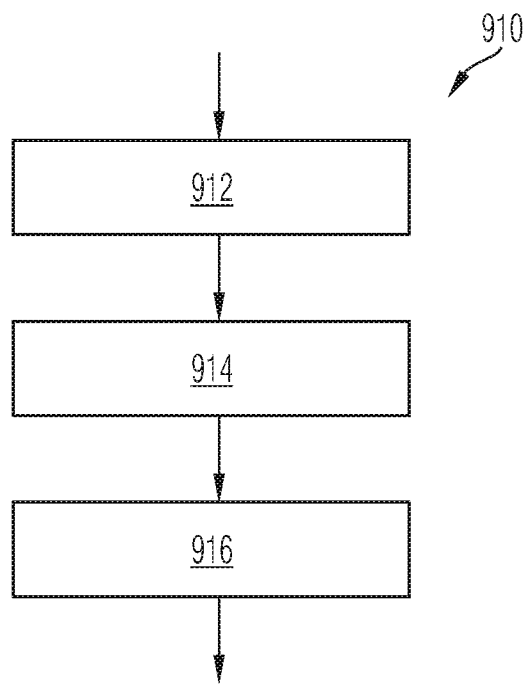
FIG. 1 is a schematic flowchart for illustrating a method of manufacturing semiconductor devices, in which gate dielectric reliability for the on-state and gate dielectric reliability for the off-state are in balance, according to an embodiment.

FIG. 1 refers to a method 910 of manufacturing a semiconductor device that includes a plurality of transistor cells electrically connected in parallel to each other.

A semiconductor body of the semiconductor device is from a material with significantly higher breakdown field than silicon, for example, at least $1*10^6$ V/cm (1E06 Vcm$^{-1}$) or at least $2*10^6$ V/cm (2E06 Vcm$^{-1}$). According to an embodiment, the semiconductor body is from silicon carbide. For example, the semiconductor body is of the 4H polytype (4H—SiC) and has a breakdown field of approximately $3*10^6$ V/cm (3E06 Vcm$^{-1}$).

The transistor cells may be field effect transistor cells with planar gate structures or with trench gate structures, wherein a trench gate structure extends from a first surface into the semiconductor body and may have two orthogonal lateral dimensions parallel to the first surface within the same order of magnitude, e.g., approximately equal orthogonal lateral dimensions. According to another embodiment, the trench gate structures are stripe-shaped with a first lateral dimension along a longitudinal axis exceeding a second lateral direction orthogonal to the longitudinal axis by more than one order of magnitude. According to a further embodiment a trench gate structure may form a grid. Sidewalls of the trench gate structures may be orthogonal to the first surface or may be tilted to the first surface, wherein at least one of the sidewalls of each trench gate structure may be parallel to a main crystal plane with high charge carrier mobility.

The transistor cell may be symmetric with a two-sided channel and an on-state current flow along two opposite sidewalls of the trench gate structure or may be asymmetric with a one-sided channel and an on-state current flow only along one of the sidewalls of the trench gate structure.

The gate structure includes a gate dielectric separating a conductive gate electrode from the semiconductor body. The gate electrode forms or is electrically connected to a gate terminal. The gate dielectric may be or may include a silicon oxide layer, by way of example. A drain-side portion of the gate dielectric directly adjoins to a connection portion of a drift structure that further includes a lightly doped drift zone. In the off state of the transistor cell, the voltage drop across at least a subsection of the drain-side portion depends on a drain-to-source voltage $V_{DS,off}$ applied between a drain terminal and a source terminal of the semiconductor device in the off state.

The gate dielectric further includes a source-side portion that directly adjoins to such doped regions that are directly electrically connected to a source potential applied to the source terminal, wherein, in the off state of the transistor cell, a voltage drop across the source-side portion does not or only to a marginal degree depends on $V_{DS,off}$. Doped regions adjoining to the source-side portion may have a conductivity type complementary to the conductivity type of the drift structure or may have the same conductivity type as the drift structure. The doped regions include but are not limited to a source region and a body region, wherein the body region forms a first pn junction with the drift structure as well as a second pn junction with the source region. A diode region that may include a shielding portion forms a third pn junction with the drift structure.

The transistor cell is in an off state, when an off state gate-to-source voltage $V_{GS,off}$ is applied between the gate terminal and the source terminal, wherein for n-channel transistor cells the off state gate-to-source voltage $V_{GS,off}$ is lower than a threshold voltage Vth. The transistor cell is in an on state, when an on state gate-to-source voltage $V_{GS,on}$ is applied between the gate terminal and the source terminal, wherein for n-channel transistor cells the on state gate-to-source voltage $V_{GS,off}$ is greater than the threshold voltage Vth.

The method 910 includes a determining step 912 for a set of design parameters for the transistor cell and the drift structure such that an on state FIT (failure-in-time) rate and an off state FIT rate of the gate dielectric of the transistor cell are within the same order of magnitude for a set of predefined values for the on-state gate-to-source voltage $V_{GS,on}$, the off-state gate-to-source voltage $V_{GS,off}$, and the off-state drain-to-source voltage $V_{DS,off}$.

A FIT rate is given by the number of failures in 1E09 hours of operating time. The FIT rate of a dielectric layer depends, inter alia, on electric stress the dielectric layer is exposed to and its dimensions. For a given material configuration and thickness, the FIT rate of the gate dielectric depends on its lateral extension (area) and on the electric field in the gate dielectric. The higher the electric field and the greater the area, the higher is the FIT rate of the gate dielectric.

The electric field in the gate dielectric depends on the electric field in the neighboring portions of the semiconductor body. The electric field in portions of the semiconductor body close to the gate dielectric is a function of the applied voltages $V_{GS,on}$, $V_{GS,off}$ and $V_{DS,off}$ and further depends on design parameters of the gate structure and the drift structure.

The determining step 912 determines a set of design parameters for a target transistor cell such that the on state FIT rate and the off state FIT rate of the target transistor cell are within a same order of magnitude for predefined values of $V_{GS,on}$, $V_{GS,off}$ and $V_{DS,off}$.

For an n-channel transistor cell the predefined off state gate-to-source voltage $V_{GS,off}$ may be any voltage above a minimum gate-to-source voltage $V_{GSmin}$ and below the minimum nominal threshold voltage Vthmin as specified in a data sheet of the semiconductor device, wherein at an ambient temperature of 25° C. the minimum gate-to-source voltage $V_{GSmin}$ may be −10V and the minimum nominal threshold voltage Vthmin of an n-channel transistor cell may be in a range from +2.5V to about +4V.

The predefined off state gate-to-source voltage $V_{GS,off}$ may be equal to a recommended off state gate-to-source voltage defined in the data sheet. The recommended off state gate-to-source voltage may be that gate-to-source voltage for which the data sheet defines input and output capacitance Ciss, Coss. According to an embodiment, the predefined value of the off state gate-to-source voltage $V_{GS,off}$ may be, e.g., in a range from −10V to Vthmin, for example, 0V, −4V, −5V or −10V.

For an n-channel transistor cell the predefined on state gate-to-source voltage $V_{GS,on}$ may be any voltage below a maximum gate-to-source voltage $V_{GSmax}$ and above the maximum nominal threshold voltage Vthmax, wherein at an ambient temperature of 25° C. the maximum gate-to-source voltage $V_{GSmax}$ may be +22V and the maximum nominal threshold voltage Vthmax of an n-channel transistor cell may be in a range from +4V to about +5.6V.

The predefined on state gate-to-source voltage $V_{GS,on}$ may be equal to a recommended on state gate-to-source voltage defined in the data sheet. The recommended on state gate-to-source voltage may be that gate-to-source voltage for which the data sheet defines switching losses and RDSon. According to an embodiment, the predefined value of the on state gate-to-source voltage $V_{GS,on}$ may be, e.g., in a range from Vthmax to +22V, for example, +10V, +15V, +18V or +20V.

The off state drain-to-source voltage $V_{DS,off}$ is applied between the drain terminal and the source terminal of the transistor cell and is at most a nominal maximum blocking voltage VDS,max of the semiconductor device as specified in the data sheet. For a semiconductor device based on SiC, $V_{DS,max}$ may be 600V, 650V, 700V, 1000V, 1200V, 1700V, 3.2 kV, 3.3 kV, 6.5 kV, by way of example.

According to an embodiment the predefined values for $V_{GS,on}$ and $V_{GS,off}$ may correspond to values for $V_{GS,on}$, $V_{GS,off}$ labeled as recommended values in a data sheet containing the specifications of the semiconductor device. According to another embodiment the predefined values for $V_{GS,on}$, $V_{GS,off}$ correspond to the signal levels of a square output signal of a gate driver circuit used in combination with the semiconductor device.

According to an embodiment the determining step 912 determines a set of design parameters for a target transistor cell such that a ratio of off state FIT rate and on state FIT rate of the target transistor cell is in a range from 0.1 to 10, e.g., in a range from 0.2 to 5 for a predefined range of $V_{DS,off}$ that corresponds to a range of a maximum electric field in the drift structure from 50% to 90%, e.g., from 60% to 75% of the breakdown electric field of the semiconductor material, e.g., silicon carbide. The maximum electric field may form along the pn junction between the drift zone and a body region or a shielding structure.

The determining step 912 may be carried out by a processor device on the basis of mathematical equations or models. For example, a processor device may run a simulation. Alternatively, model transistor cells embodying different sets of design parameters may be formed. To each model transistor cell the predefined values for $V_{GS,off}$ and $V_{DS,off}$ may be applied and the resulting electric field may be measured in portions of the drift structure close to the gate dielectric of the model transistor cells, e.g., through suitable voltage measurements across the gate dielectric 159. The results of the measurements may be used to estimate the set of design parameters fulfilling the above-mentioned condition for the on state FIR rate and the off state FIR rate of the gate dielectric.

An output step 914 may output the set of design parameters through an electronic interface of the processor device. The electronic interface may be a machine/human interface or machine/machine interface. For example, an interface unit which is data-linked to the processor device outputs the set of design parameters to a user, to a manufacturing system for semiconductor devices, and/or to a layout and design tool calculating further design parameters of structures of the semiconductor device by taking into consideration both the target set of design parameters and further target characteristics of the semiconductor device.

A transforming step 916 may follow that may use, e.g., an ion implanter, an etching chamber, a lithography tool and a heating chamber to form a transistor cell and a drift structure according to the set of design parameters in a device region of a wide band-gap semiconductor substrate.

By selecting the design parameters such that the FIT rates for the on state and the off state are within the same order of magnitude, a total stress the gate dielectric is exposed to in the on state is approximately the same as in the off state. This results in a low cumulated FIT rate for the gate dielectric in most applications without increasing an area-specific on state resistance $R_{DS,on} \times A$ more than necessary.

In the on state, the effective drain-to-source voltage $V_{DS,on}$ across the semiconductor device is typically not greater than 1V and an on state voltage drop $V_{Dk,on}$ across the gate dielectric is equal to or at least closely approximates the gate-to-source voltage $V_{GS,on}$ an external circuit applies in the on-state, e.g., a voltage in a range from +15V to +22V for SiC MOSFETs. Apart from such doped regions that are connected to drain potential, all doped regions directly adjoining to the trench gate structure are directly connected to the source potential such that $V_{Dk,on}$ deviates by not more than 1V from the on state gate-to-source voltage $V_{GS,on}$ in a total gate dielectric area $A_{G,on}$ between the conductive gate electrode and the semiconductor body. In each portion of the gate dielectric, the electric field strength is approximately $V_{GS,on}$ divided by the gate dielectric thickness.

In the off-state a voltage close to the off-state gate-to-source voltage $V_{GS,off}$ applied by the external circuit between the gate terminal and the source terminal drops across the source-side portion of the gate dielectric, wherein the source-side portion directly adjoins to such doped regions that are directly connected to the source potential, including the source region, body region and, if applicable, a shielding portion of the conductivity type of the body regions.

By contrast, the drain-side portion of the gate dielectric directly adjoins to the connection portion of the drift structure that is connected to the drain potential and a local voltage drop across the drain-side portion in the off state depends on the applied drain-to-source voltage $V_{DS,off}$, the off-state gate-to-source voltage $V_{GS,off}$ and the shielding concept.

For example, the drain-side portion of the gate dielectric may include a weakly-shielded portion in which the voltage drop across the gate dielectric at least 90% of a maximum local voltage drop across the drain-side portion, because of the absence of any shielding or because of a shielding that is effective only to some degree, whereas in a strongly-shielded subsection the shielding concept may significantly reduce the voltage drop across the gate dielectric.

The determining step 912 balances the FIT rates for on state and off state and can take into account that an area stressed in the on state, which is equal to the total gate dielectric area $A_{G,on}$ differs from a partial gate dielectric area $A_{G,off}$ predominantly stressed in the off state, wherein the partial gate dielectric area $A_{G,off}$ depends on the shielding concept and is equal to or smaller than the area of the drain-side section of the gate dielectric.

Conventionally, there is a significant imbalance between on-state reliability and off-state reliability. If the design of the transistor cell and the drift structure results in that the gate dielectric breaks down predominantly in the on-state it points to an undue and exaggerated shielding of the gate dielectric for the off-state, wherein the high breakdown reliability for the off-state is achieved at the expense of device performance, e.g., a higher than necessary on state resistance $R_{DS,on}$ or higher than necessary switching losses.

If the imbalance results in that the gate dielectric predominantly breaks down in the off-state, it points to that the gate dielectric thickness and/or use voltage in the on-state are selected too conservatively and leave room for improvement. Further, since a lower $V_{GS,off}$ in the off-state has significant impact on the gate dielectric breakdown in the off-state and since the voltage drop across the gate dielectric depends on the shielding concept and is typically not defined in a data sheet, the FIT rate may be higher than expected, e.g., when the application applies a more negative off-state gate-to-source voltage $V_{GS,off}$.

According to an embodiment the set of design parameters is determined such that an average voltage drop in the partial gate dielectric area $A_{G,off}$ in the off state deviates by not more than ±2V from a sum of the on state gate-to-source voltage $V_{GS,on}$ and a product of 1V and a logarithm of a ratio of the total gate dielectric area $A_{G,on}$ and the partial gate dielectric area $A_{G,off}$ as specified in equation (1):

$$-2V + V_{GS,on} + 1[V] \cdot \ln\left(\frac{A_{G,on}}{A_{G,off}}\right) \le \qquad (1)$$
$$V_{Dk,off} \le +2V + V_{GS,on} + 1[V] \cdot \ln\left(\frac{A_{G,on}}{A_{G,off}}\right)$$

The total effective gate dielectric area $A_{G,on}$, in which the on state voltage $V_{Dk,on}$ drops across the gate dielectric, includes the drain-side portion and the source-side portion of the gate dielectric. The on state voltage drop $V_{Dk,on}$ can be approximated with the gate-to-source voltage $V_{GS,on}$ applied between the gate terminal and the source terminal of the semiconductor device in the on-state. For SiC-MOSFETs, $V_{GS,on}$ may be in a range from +15V to +22V, e.g., equal to +15V.

The partial gate dielectric area $A_{G,off}$ relevant for obtaining the average voltage drop $V_{Dk,off}$ in the off state may be set equal to the complete drain-side portion of the gate dielectric or may be set equal to an estimated weakly-shielded subsection of the drain-side portion, wherein in the weakly-shielded subsection an estimated local voltage drop in the off-state is at least 90% of a local maximum voltage drop across the weakly-shielded subsection.

Then the determining step 912 determines the design parameters such that the transistor cell shows an average voltage drop $V_{Dk,off}$ across the partial gate dielectric area $A_{G,off}$ in the off state that fulfills equation (1). A polarity of $V_{Dk,off}$ is opposite to the polarity of $V_{Dk,on}$. The design parameters available to be determined concern dimensions and a doping in the connection portion, a vertical dimension and the doping in the drift zone, the vertical dimension of the trench gate structure, and parameters of the gate dielectric such as layer thickness and curvature in case the weakly-shielded subsection includes a corner.

According to an embodiment, in addition to the area ratio $A_{G,on}/A_{G,off}$ the determining step 912 may consider a mission profile of the semiconductor device, wherein the mission profile gives a ratio between the estimated total on-time ton of the semiconductor device in which the transistor cells are in the on-state and the estimated total off-tune toff during which the semiconductor device and the transistor cells are in the off-state. The mission profile is given by a respective application, e.g, by typical duty cycles in a power conversion application. In typical mission profiles toff is greater than 0.01*ton and smaller than 100*ton.

According to the embodiment considering mission profiles, the design parameters are calculated such that in the off state the average voltage drop $V_{Dk,off}$ in the partial gate dielectric area $A_{G,off}$ deviates by not more than ±2V from the sum of the on state gate-to-source voltage $V_{GS,on}$ and the product of 1V and the logarithm of the product of the ratio of the total gate dielectric area $A_{G,on}$ to the partial gate dielectric area $A_{G,off}$ and the ratio of the estimated total on-state time ton and the estimated total off-state time toff according to equation (2):

$$-2V + V_{GS,on} + 1[V] \cdot \ln\left(\frac{A_{G,on} \cdot t_{on}}{A_{G,off} \cdot t_{off}}\right) \le \quad (2)$$

$$V_{Dk,off} \le +2V + V_{GS,on} + 1[V] \cdot \ln\left(\frac{A_{G,on} \cdot t_{on}}{A_{G,off} \cdot t_{off}}\right)$$

According to an embodiment, predefined values of a semiconductor device include $V_{GS,on}$, $V_{GS,off}$, $V_{DS,off}$, a thickness and composition of the gate dielectric and the total gate dielectric area $A_{G,on}$ and the determining step 912 determines the thickness of an epitaxial layer in which the source region, the body region, the drift zone and the connection portion are formed, the parameters of the connection portion and of counterdoped regions relevant for the shielding concept, and, in case the transistor cells are based on a trench gate concept, the vertical extension of the trench gate structure as well as the alignment of the doped regions to the trench gate structures in a way that the on state and off state FIT rates are balanced as described above.

Due to the typically smaller stressed area in the off state with respect to the on state and due to shorter use time in the off state than in the on state for certain applications the allowed electric field in the off state can be higher than the allowed electric field in the on state to achieve the FIT rate balance. The stressed area in the off state may be approximated by the vertical projection of buried shielding portions onto the trench gate structure.

Once having evaluated the ideal electric field or voltage in the off state that fulfills the condition for the FIT rate balance, the shielding concept may be relaxed or tightened to achieve an improved trade-off between on state resistance and gate oxide reliability. The considerations apply to both trench gate concepts and planar gate concepts.

Figure 2:
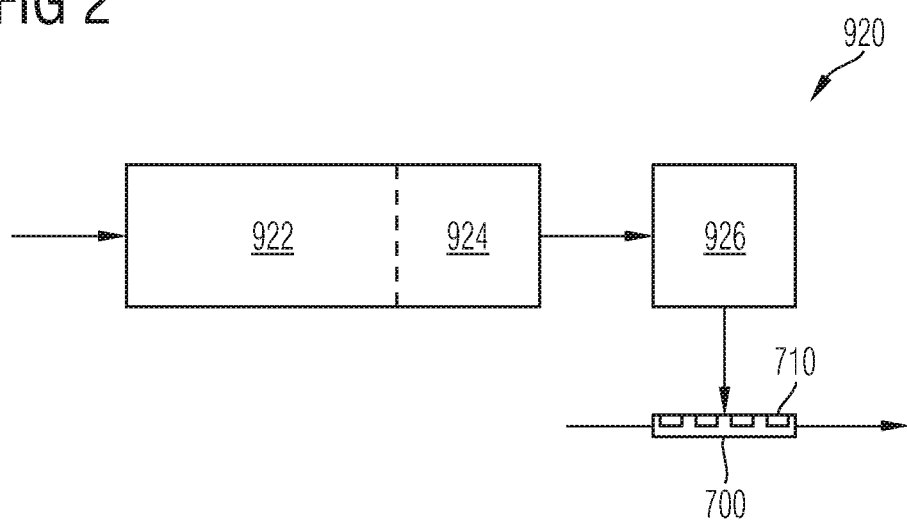
FIG. 2 is a schematic block diagram illustrating an apparatus for performing the process of FIG. 1 according to a further embodiment.

FIG. 2 is a block diagram for main means 920 for performing the method 910 of FIG. 1.

The main means 920 may include first means 922 for determining a set of design parameters for a transistor cell and a drift structure such that an on state FIT rate and an off state FIT rate of a gate dielectric of the transistor cell are within the same order of magnitude for a set of predefined values for the on-state gate-to-source voltage $V_{GS,on}$, the off-state gate-to-source voltage $V_{GS,off}$ and the off-state drain-to-source voltage $V_{DS,off}$.

The first means 922 may include a processor device using mathematical equations or a simulation model. For example, a processor device may run a simulation program simulating the electric field distribution in a virtual semiconductor body for different sets of parameters and selects the parameters of that simulation that fits best with one of the equations (1) or (2) as a suitable set of design parameters.

Alternatively, model transistor cells embodying different sets of design parameters may be formed. To each model transistor cell the predefined values for $V_{GS,off}$ and $V_{DS,off}$ may be applied and the resulting electric field may be measured in portions of the drift structure close to the gate dielectric of the model transistor cells, e.g., through suitable voltage measurements across the gate dielectric 159. The results of the measurements may be used to estimate the set of design parameters fulfilling the above-mentioned condition for the on state FIR rate and the off state FIR rate of the gate dielectric.

The first means 922 may include second means 924 for outputting the set of design parameters. For example, the second means 924 may include an electronic interface, which may be a machine/human interface or a machine/machine interface. The second means 924 is data-linked to the first means 922 and outputs the set of design parameters to a user, to a manufacturing system for semiconductor devices, and/or to a layout and design tool calculating further design parameters of structures of the semiconductor device by taking into consideration both the set of design parameters and further target characteristics of the semiconductor device.

Third means 926 for forming transistor cells and drift structures may receive the set of design parameters or other parameters derived from the set of design parameters and form a drift structure and a transistor cell according to the set of design parameters output by the second means 924. The third means 926 may include parts of a manufacturing system for semiconductor devices, e.g., an ion implanter, an etching chamber, a lithography tool and a heating chamber that form a transistor cell and a drift structure according to the set of design parameters in a device region 710 of a wide band-gap semiconductor substrate 700.

The following Figures refer to semiconductor devices 500 with doped structures and trench gate structures which parameters are obtained by a process as described above.

In FIGS. 3A to 3E the concerned semiconductor device 500 includes asymmetric transistor cells TC forming conductive inversion channels at only one sidewall of each trench gate structure 150. A plurality of identical transistor cells TC is formed next to each other, wherein the transistor cells are electrically connected in parallel.

The semiconductor device 500 may be or may include an IGFET (insulated gate field effect transistor), for example, an MOSFET (metal oxide semiconductor FET) in the usual meaning concerning FETs with metal gate electrodes as well as FETs with gate electrodes from or including semiconductor material, or an MCD (MOS controlled diode), by way of example.

The semiconductor device 500 is based on a semiconductor body 100 from a crystalline semiconductor material with a breakdown field that is higher than the breakdown field in silicon, e.g., at least $1*10^6$ V/cm (1E06 Vcm$^{-1}$). The semiconductor material may have a hexagonal crystal lattice and may be silicon carbide (SiC), for example, 2H—SiC (SiC of the 2H polytype), 6H—SIC or 15R—SiC. According to an embodiment the semiconductor material is silicon carbide of the 4H polytype (4H—SiC).

At a front side the semiconductor body 100 has a first surface 101 which may include coplanar surface sections. The first surface 101 may coincide with a main crystal plane or may be tilted to a main crystal plane by an off-axis angle α, which absolute value may be at least 2° and at most 12°, e.g., about 4°.

In the illustrated embodiment, the <0001> crystal axis is tilted by an off-axis angle α>0 to the normal and the <11-20> crystal axis is tilted by the off-axis angle α with respect to a horizontal plane. The <1-100> crystal axis is orthogonal to the cross-sectional plane.

According to an embodiment, the first surface 101 may be serrated and includes parallel first surface sections shifted to each other and tilted to a horizontal plane by the off-axis angle α as well as second surface sections tilted to the first surface sections and connecting the first surface sections such that a cross-sectional line of the serrated first surface 101 approximates a saw-tooth line.

On the back of the semiconductor body 100 an opposite second surface 102 may extend parallel to a planar first surface 101 or to a mean plane of a serrated first surface 101. A distance between the first surface 101 at the front and a second surface 102 on the back is related to a nominal blocking capability of the semiconductor device 500. A total thickness of the semiconductor body 100 between the first and second surfaces 101, 102 may be in the range of several hundred nm to several hundred μm. The normal to the first surface 101 defines a vertical direction and directions parallel to the first surface 101 are horizontal directions.

The transistor cells TC are formed at the front side along the first surface 101. A drift structure 130 separates the transistor cells TC from the second surface 102 on the back. The drift structure 130 may include a heavily doped contact structure 139 directly adjoining to the second surface 102 and a lightly domed drift zone 131 between the transistor cells TC and the heavily doped contact structure 139.

The heavily doped contact structure 139 may be or may include a substrate portion obtained from a crystalline ingot and forms an ohmic contact with a second load electrode 320 that directly adjoins to the second surface 102. A mean dopant concentration in the contact structure 139 is sufficiently high to form an ohmic contact with the second load electrode 320. In case the semiconductor device 500 is or includes an IGFET, the contact structure 139 has the same conductivity type as the drift zone 131.

The drift zone 131 may be formed in a layer grown by epitaxy on the contact structure 139. A mean net dopant concentration in the drift zone 131 may be in the range from 1E15 cm$^{-3}$ to 5E16 cm$^{-3}$ in case the semiconductor body 100 is from silicon carbide. The drift structure 130 may include further doped regions, for example field stop zones, barrier zones and/or current spread zones of the conductivity type of the drift zone 131.

The drift zone 131 may directly adjoin to the contact structure 139 or a buffer layer forming a unipolar junction with the drift zone 131 may be sandwiched between the drift zone 131 and the contact structure 139, wherein a vertical extension of the buffer layer may be approximately 1 μm and a mean dopant concentration in the buffer layer may be in a range from 3E17 cm$^{-3}$ to 1E18 cm$^{-3}$, by way of example.

The transistor cells TC are oriented along trench gate structures 150 that extend from the first surface 101 into the semiconductor body 100, wherein mesa portions 190 of the semiconductor body 100 separate neighboring trench gate structures 150.

A longitudinal extension of the trench gate structures 150 along a first horizontal direction may be greater than a transverse extension along a second horizontal direction orthogonal to the first horizontal direction. The trench gate structures 150 may be long stripes extending from one side of a transistor cell region to an opposite side, wherein the length of the trench gate structures 150 may be up to several hundred micrometers. According to other embodiments a plurality of separated trench gate structures 150 may be formed along a line extending from one side of the transistor cell region to the opposite side, or the trench gate structures 150 may form a grid with the mesa portions 190 formed in the meshes of the grid.

At the bottom, the trench gate structures 150 may be rounded, wherein a radius of the inner curvature is at least twice the thickness of a gate dielectric 159 described in the following.

The trench gate structures 150 may be equally spaced, may have equal width, and may form a regular pattern, wherein a pitch (center-to-center distance) of the trench gate structures 150 may be in a range from 1 μm to 10 μm, e.g., from 2 μm to 5 μm. A vertical extension of the trench gate structures 150 may be in a range from 0.3 μm to 5 μm, e.g., in a range from 0.5 μm to 2 μm.

The trench gate structures 150 may be orthogonal to the first surface 101 or may taper with increasing distance to the first surface 101. For example, a taper angle β of the trench gate structures 150 with respect to the vertical direction may be equal to the off-axis angle α or may deviate from the off-axis angle α by not more than ±1 degree such that at least a first sidewall 191 of two opposite longitudinal sidewalls 191, 192 is formed by a main crystal plane with high charge carrier mobility, e.g., a {11-20} crystal plane. A second sidewall 192 opposite to the first sidewall 191 may be tilted to a main crystal plane by twice the off-axis angle α, e.g., by 4 degree or more, for example, by about 8 degree. The first and second sidewalls 191, 192 of the same mesa portion 190 are on opposite longitudinal sides of the intermediate mesa portion 190 and directly adjoin to two different, neighboring trench gate structures 150.

The trench gate structures 150 include a conductive gate electrode 155 which may include or consist of a heavily doped polycrystalline silicon layer and/or a metal-containing layer. The gate electrode 155 may be electrically connected to a gate metallization 330 that forms or that is electrically connected or coupled to a gate terminal G.

The trench gate structures 150 further include a gate dielectric 159 separating the gate electrode 155 from the semiconductor body 100 along at least one side of the trench gate structure 150. The gate dielectric 159 may include or consist of a semiconductor dielectric, for example, thermally grown or deposited semiconductor oxide, e.g., silicon oxide, a semiconductor nitride, for example deposited or thermally grown silicon nitride, a semiconductor oxynitride, for example silicon oxynitride, any other deposited dielectric material or any combination thereof. The gate dielectric 159 may be formed for a threshold voltage of the transistor cells TC in a range from 1.0 V to 8 V.

The trench gate structures 150 may exclusively include the gate electrode 155 and the gate dielectric 159 or may include further conductive and/or dielectric structures in addition to the gate electrode 155 and the gate dielectric 159, e.g., compensation structures.

The mesa portions 190 include source regions 110 oriented to the front side. A source region 110 may directly adjoin the first surface 101 and either only the first sidewall 191 or both longitudinal sidewalls 191, 192 of the respective mesa portion 190. Each mesa portion 190 may include one source region 110 with interconnected sections or may include two or more sections separated from each other within the mesa portion 190 but electrically connected to each other through a low impedance path through a mesa contact structure directly adjoining the mesa portion 190.

The mesa portions 190 further include body regions 120 that separate the source regions 110 from the drift structure 130. The body regions 120 form first pn junctions pn1 with the drift structure 130 and second pn junctions pn2 with the source regions 110 and directly adjoin the first sidewalls 191. A vertical extension of the body regions 120 corresponds to a channel length of the transistor cells TC and may be in a range from 0.2 μm to 1.5 μm. Both the source regions 110 and the body regions 120 are electrically connected to a first load electrode 310 at the front side. The gate dielectric 159 capacitively couples portions of the body regions 120 with the gate electrode 155.

The first load electrode 310 may form or may be electrically connected or coupled to a source terminal S which may be effective as an anode terminal of an MCD. The second load electrode 320 on the back may form or may be electrically connected or coupled to a drain terminal D, which may be effective as a cathode terminal of an MCD.

Diode regions 140 may separate the body regions 120 and the second sidewalls 192. A dopant concentration in the diode regions 140 along the second sidewalls 192 is higher, e.g., at least ten times higher than a dopant concentration in the body regions 120 along the first sidewalls 191. The diode regions 140 form third pn junctions pn3 with the drift zone 131.

According to an embodiment, the transistor cells TC are n-channel FET cells with p-doped body regions 120, n-doped source regions 110 and n-doped drift zone 131. According to another embodiment, the transistor cells TC are p-channel FET cells with n-doped body regions 120, p-doped source regions 110 and p-doped drift zone 131.

The diode regions 140 may have a vertical extension that is greater than a vertical extension of the trench gate structures 150. A shielding portion 145 of the diode structure has a greater distance to the first surface 101 than a bottom of the adjoining trench gate structure 150 and laterally extends along a bottom of the adjoining trench gate structure 150 such that the shielding portion 145 partially separates the trench gate structure 150 from the drift zone 131 and shields at least a portion of the gate dielectric 159 against the potential of the drift structure 130. A portion of the drift structure 130 between neighboring shielding portions 145 forms a connection portion 135.

The connection portion 135 forms the first pn junction pn1 with the body region 120, directly adjoins to the trench gate structure 150 and directly adjoins to the drift zone 131. A net dopant concentration Ncp in the connection portion 135 may be higher than a net dopant concentration Ndr in the drift zone 131.

Figure 3A:
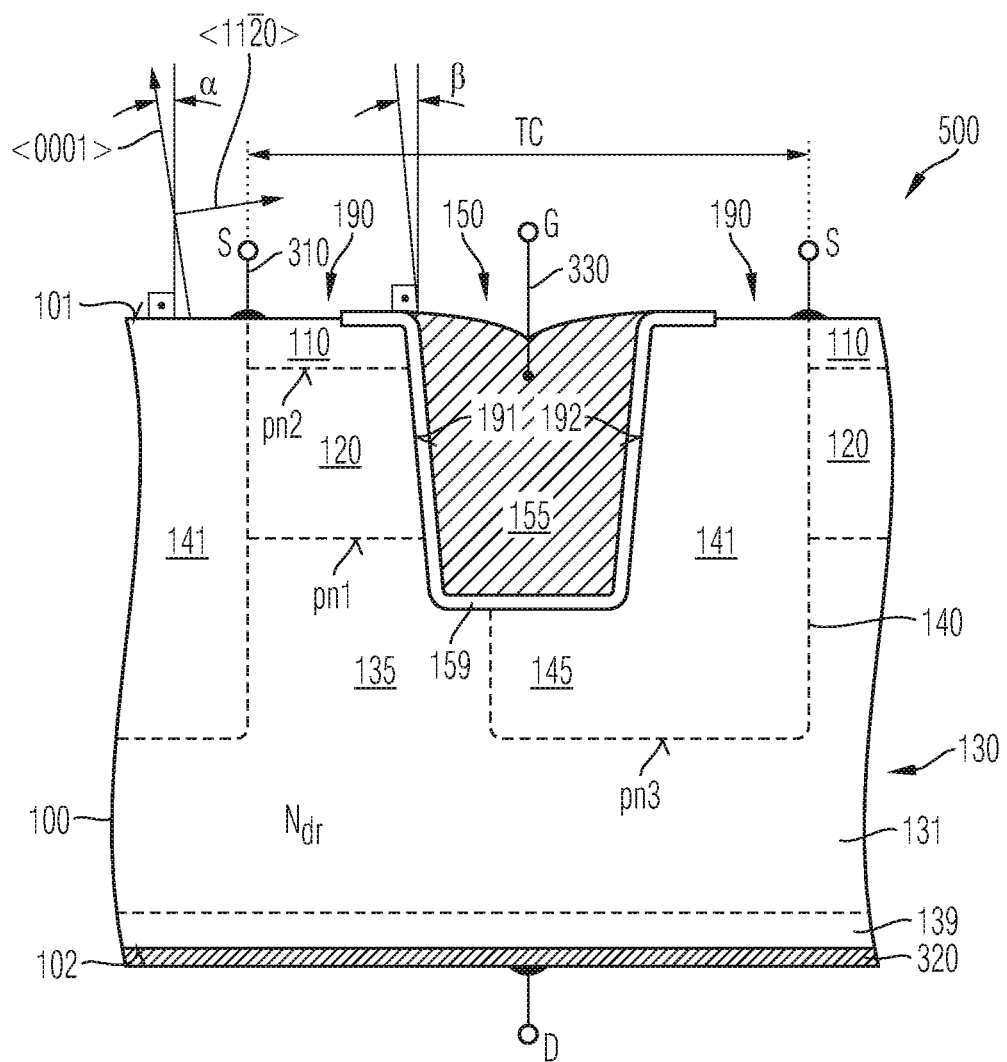
FIG. 3A is a schematic vertical cross-sectional view of a transistor cell of a semiconductor device based on a semiconductor material with high dielectric breakdown field strength according to an embodiment related to transistor cells with field effect controlled channels formed at one side of trench gate structures.
Figure 3B:
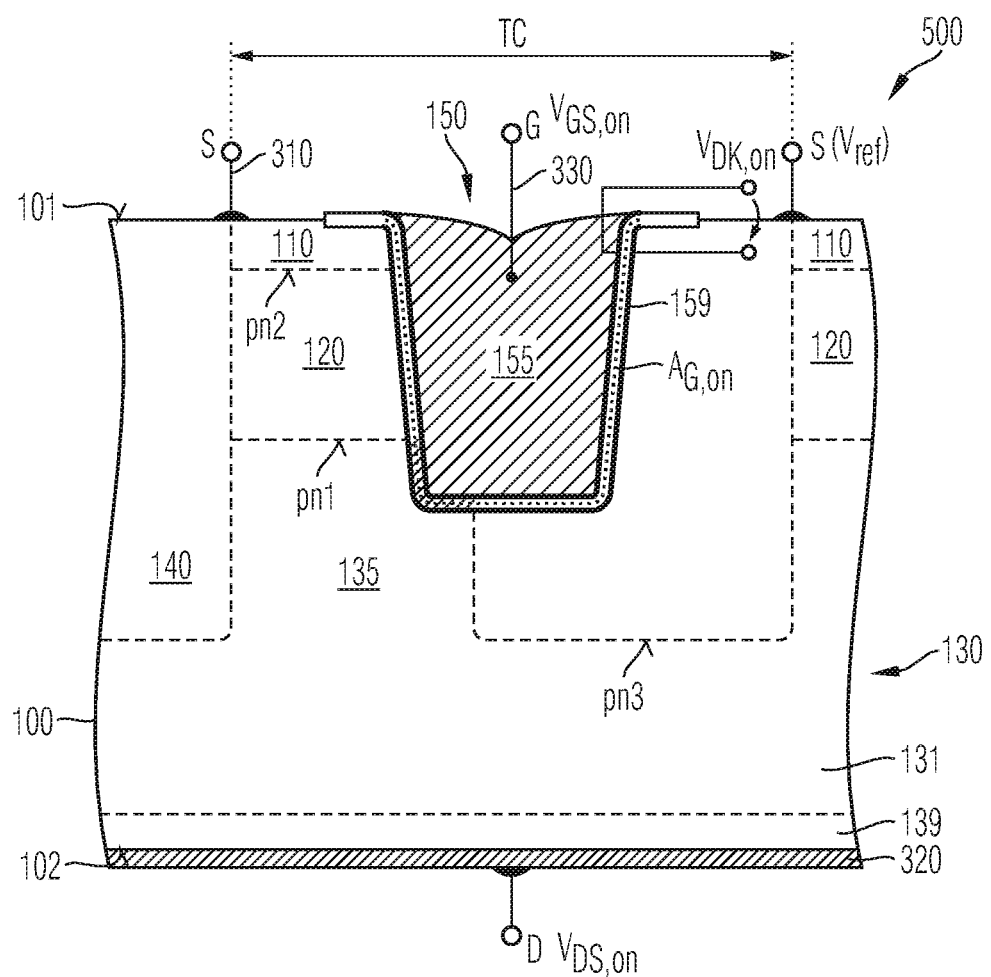
FIG. 3B is a further schematic vertical cross-sectional view of the transistor cell of FIG. 3A and illustrates a total effective gate dielectric area $A_{G,on}$ across which an on-state voltage $V_{Dk,on}$ drops in the on state of the transistor cell.

FIG. 3B refers to the on state of the semiconductor device 500 of FIG. 3A.

In the on state, an on state gate-to-source voltage $V_{GS,on}$ applied between the gate terminal G and the source terminal S is higher than the threshold voltage Vth defined in the data sheet of the semiconductor device 500, the resulting electric field effects that the minority charge carriers in the body regions 120 form inversion channels along the gate dielectric 159, wherein the inversion channels connect the source regions 110 with the drift structure 130 and the semiconductor device 500 turns on. In the on state a load current flows between the first and second load electrodes 310, 320 through the semiconductor body 100 along the first sidewalls 191.

The on state gate-to-source voltage $V_{GS,on}$ is typically in a range from 15V to 22V for n-type SiC-TMOSFETs (SiC Trench MOSFETs). The potential of the source region 110, the body region 120, and the diode region 140 including the shielding portion 145 is equal or very close to the potential of the source terminal S. The potential of the connection portion 135 deviates from the source potential by typically not more than 1V. The electric field strength is approximately the same across the complete area of the gate dielectric 159 between the gate electrode 155 and the semiconductor body 100. A total gate dielectric area $A_{G,on}$ relevant for calculation of the design parameters is the complete area of the gate dielectric 159 between the gate electrode 155 and the semiconductor body 100. The on state voltage drop $V_{Dk,on}$ across the gate dielectric 159 is approximately equal to $V_{GS,on}$.

The gate dielectric 159 capacitively couples portions of the body regions 120 with the gate electrode 155. When a potential at the gate electrode 155 exceeds or falls below the threshold voltage Vth, the electric field effects that the minority charge carriers in the body regions 120 form inversion channels along the gate dielectric 159, wherein the inversion channels connect the source regions 110 with the drift structure 130, wherein the semiconductor device 500 turns on. In the on state a load current flows between the first and second load electrodes 310, 320 through the semiconductor body 100 along the first sidewalls 191.

Figure 3C:
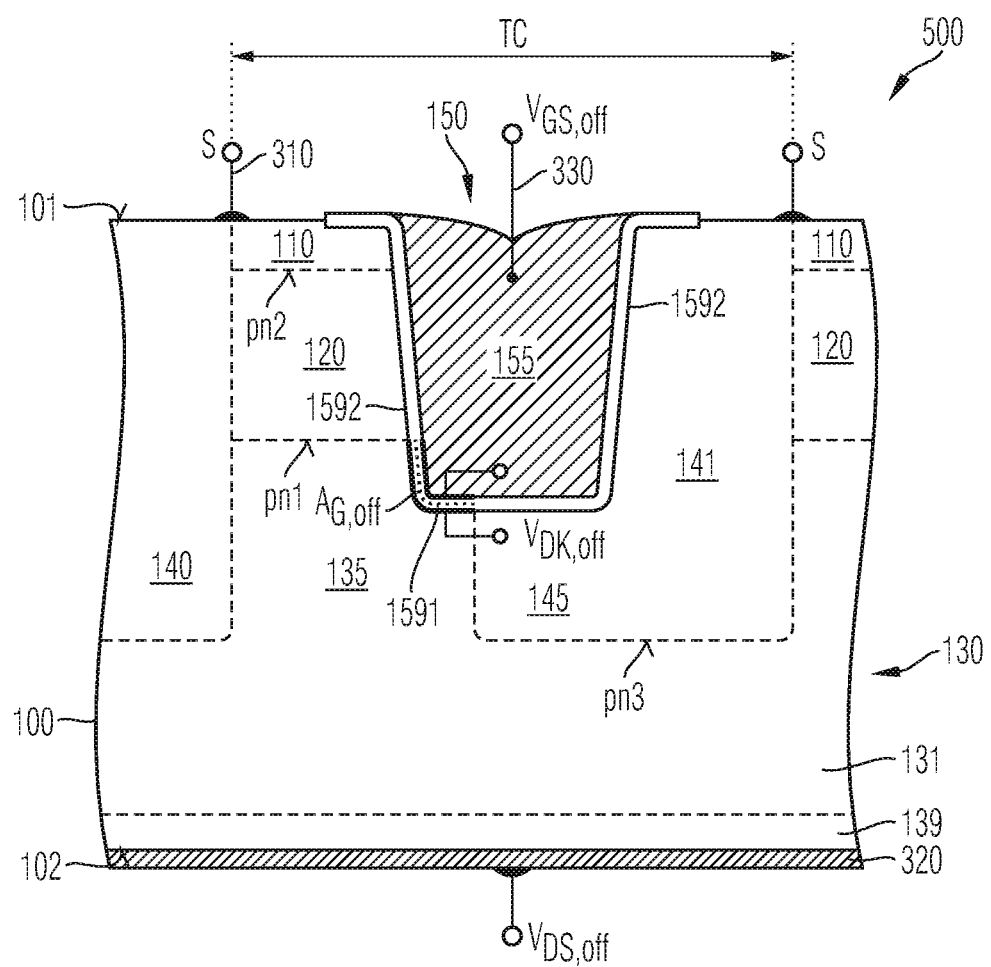
FIG. 3C is a further schematic vertical cross-sectional view of the transistor cell of FIG. 3A and illustrates a partial gate dielectric area $A_{G,off}$ across which an average off-state voltage $V_{Dk,off}$ drops in the off state of the transistor cell.

In FIG. 3C an off state gate-to-source voltage $V_{GS,off}$ below the threshold voltage of the semiconductor device 500 is applied to the gate terminal G. In a source-side portion 1592 of the gate dielectric 159 directly between the gate electrode 155 and the source region 110, the body region 120 and the diode region 140, a local voltage drop across the gate dielectric is approximately the gate-to-source voltage $V_{GS,off}$ applied in the off state.

A drain-side portion 1591 of the gate dielectric directly adjoins to the connection portion 135. In a weakly-shielded subsection of the drain-side portion 1591 a voltage drop across the gate dielectric 159 is at least twice the voltage drop in the source-side portion 1592. The partial gate dielectric area $A_{G,off}$ of a weakly-shielded subsection is considered for balancing on-state reliability and off-state reliability as discussed above. In order to fulfill equations (1) or (2) $V_{Dk,off}$ and $A_{G,off}$ are adjusted by a suitable design of the field effect transistor cell TC. $V_{Dk,off}$ is related to the design parameters of structures in the semiconductor body 100 as defined in equation (3):

$$V_{Dk,off} = \overline{E_{sb}}(V_{DS,off}, V_{GS,off}) \cdot \overline{t_{gd}} \cdot \gamma \cdot \frac{\varepsilon_{sb}}{\varepsilon_{gd}} \quad (3)$$

In equation (3), $\overline{E_{sb}}$ is the average electric field strength in the portion of the connection portion 135 directly adjoining to the drain-side portion 1591 of the gate dielectric 159. $V_{DS,off}$ is the drain-to-source voltage the semiconductor device 500 blocks in the off-state and $V_{GS,off}$ is the gate-to-source voltage an external circuit applies to the gate terminal G in the off state. The dielectric constant $\varepsilon_{sb}$ of the semiconductor body 100 may be 10 in case the semiconductor body 100 is from silicon carbide. The dielectric constant $\varepsilon_{gd}$ of the gate dielectric may be 3.9 for a gate dielectric from silicon dioxide.

$\overline{t_{gd}}$ is the average dielectric thickness of the gate dielectric in the weakly-shielded section of the drain-side portion and $\gamma$ is a curvature factor taking into account the field crowding due to the curvature of the gate dielectric 159 within the weakly-shielded section of the drain-side portion 1591, wherein $\gamma$ is equal to 1 in case of a planar device or for devices with symmetrical shielding in the vertical projection of corners of the trench gate structures. For an embodiment as illustrated in FIGS. 3A to 3E, $\gamma$ depends on the inner radius $r_{gd}$.

Figure 3D:
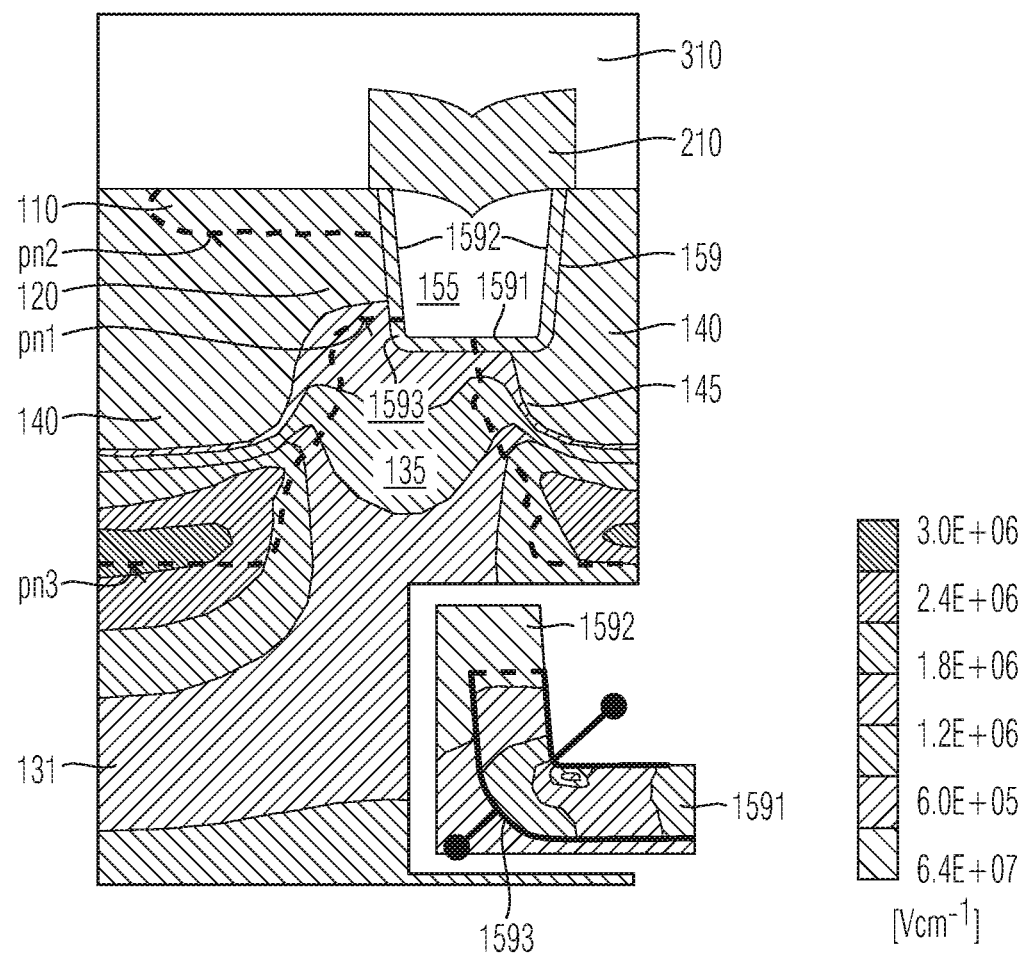
FIG. 3D is a schematic vertical cross-sectional view of a transistor cell similar to that of FIG. 3A and illustrates an electric field distribution in the transistor cell in the off state.

FIG. 3D schematically shows the electric field distribution in a transistor cell TC similar to the transistor cell shown in FIG. 3A. The dashed lines approximate the pn junctions pn1, pn2, pn3 along which the doping is balanced. The electric field is strong along the third pn junction pn3 between the shielding portion 145 and the drift zone 131.

Within the gate dielectric 159 the electric field concentrates to a high degree in a weakly-shielded subsection of the drain-side portion 1591, wherein the weakly-shielded subsection includes the weakly-shielded edge 1593 between the active first sidewall and a bottom of the trench gate structure 150. The electric field strength shows a significant peak value in the inner corner of the weakly-shielded edge 1593.

Figure 3E:
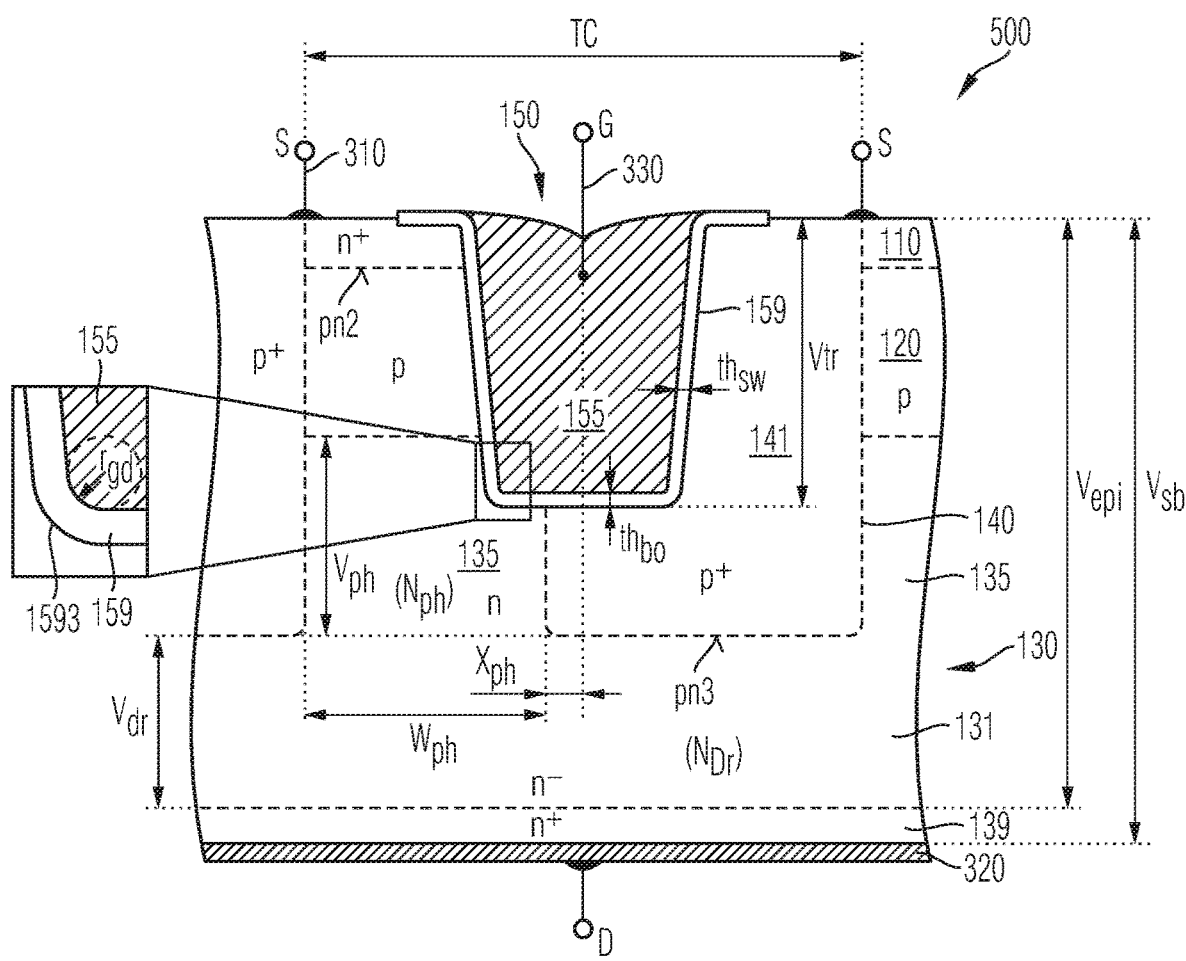
FIG. 3E is a further schematic vertical cross-sectional view of the transistor cell of FIG. 3A and illustrates design parameters adjustable to obtain a balanced off-state and on-state gate reliability.

FIG. 3E shows design parameters used for achieving suitable combinations of $V_{Dk,off}$ and $A_{G,off}$ such as a first vertical extension vph of the connection portion 135, a net doping Nph in the connection portion 135, a lateral extension wph of the connection portion 135, as well as a lateral distance xph between an edge of the connection portion 135 and a center axis of the trench gate structure 150. Further design parameters are a vertical extension vtr of the trench gate structure 150, a vertical extension vdr of the drift zone 131, a net drift zone doping Ndr, a distance vepi between the first surface 101 and the connection portion 135, a first thickness thsw of the gate dielectric 159 along the first sidewall 191 of the trench gate structures 150, a second gate dielectric thickness thbo along a bottom of the trench gate structure 150 and an inner radius rgd of a curved section of the gate dielectric 159 between the first sidewall 191 and the bottom of the trench gate structure 150 in a region directly adjoining the connection portion 135.

Figure 4A:
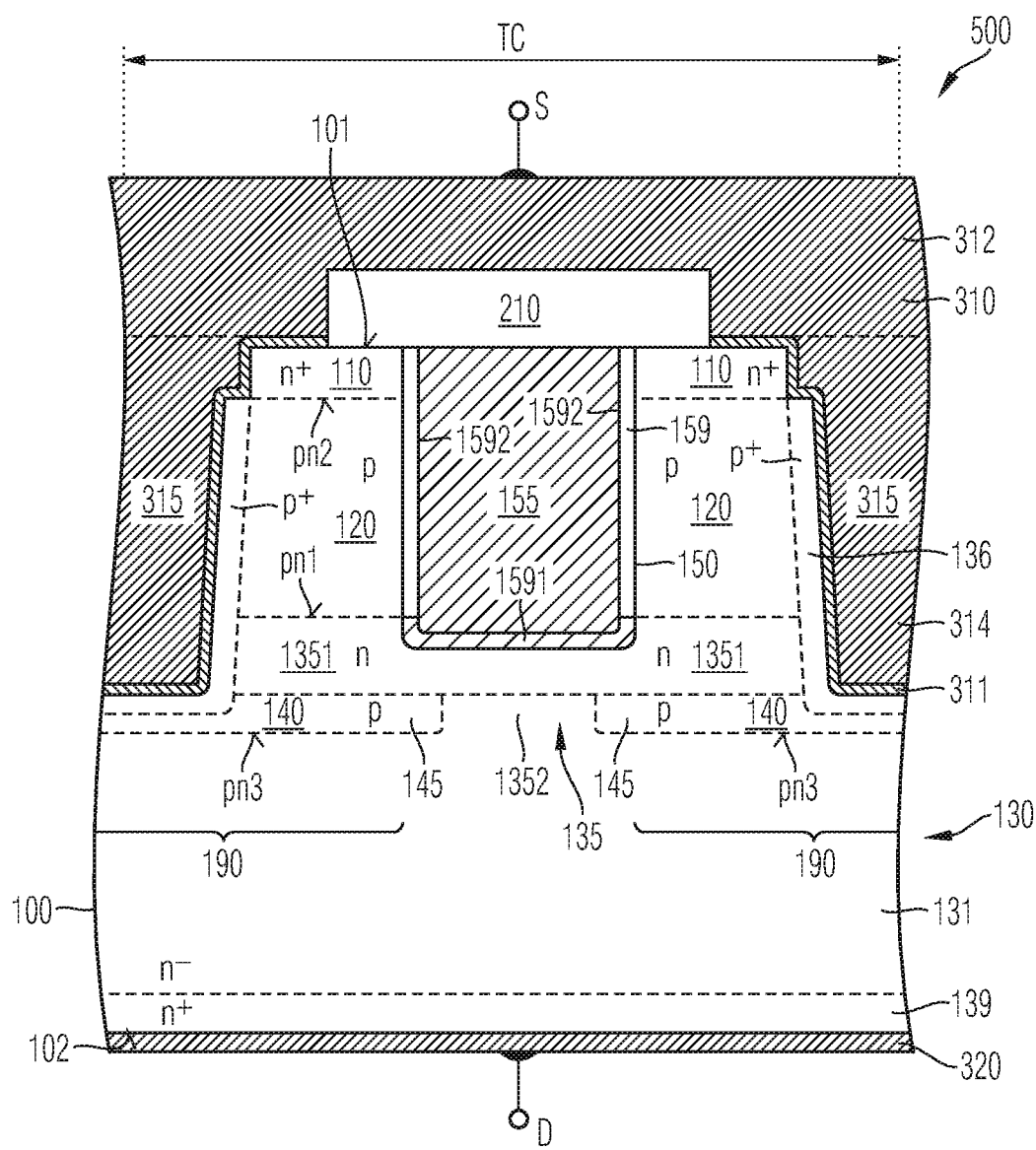
FIG. 4A is a schematic vertical cross-sectional view of a transistor cell of a semiconductor device based on a semiconductor material with high dielectric breakdown field strength according to an embodiment related to transistor cells with field effect controlled channels formed at two opposite sides of trench gate structures.
Figure 4B:
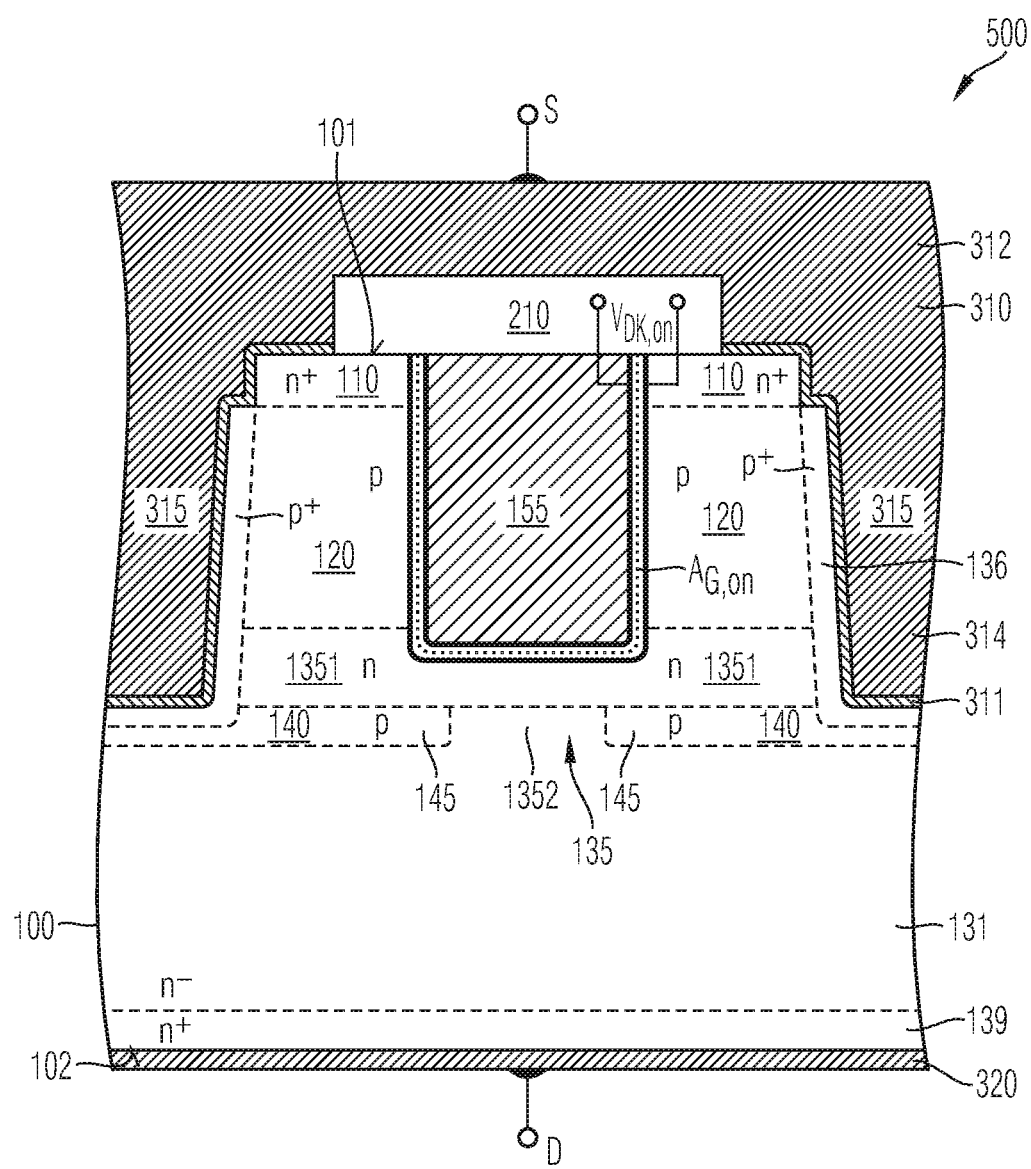
FIG. 4B is a further schematic vertical cross-sectional view of the transistor cell of FIG. 4A and illustrates a total gate dielectric area $A_{G,on}$ across which an on-state voltage $V_{Dk,on}$ drops in the on state of the transistor cell.
Figure 4C:
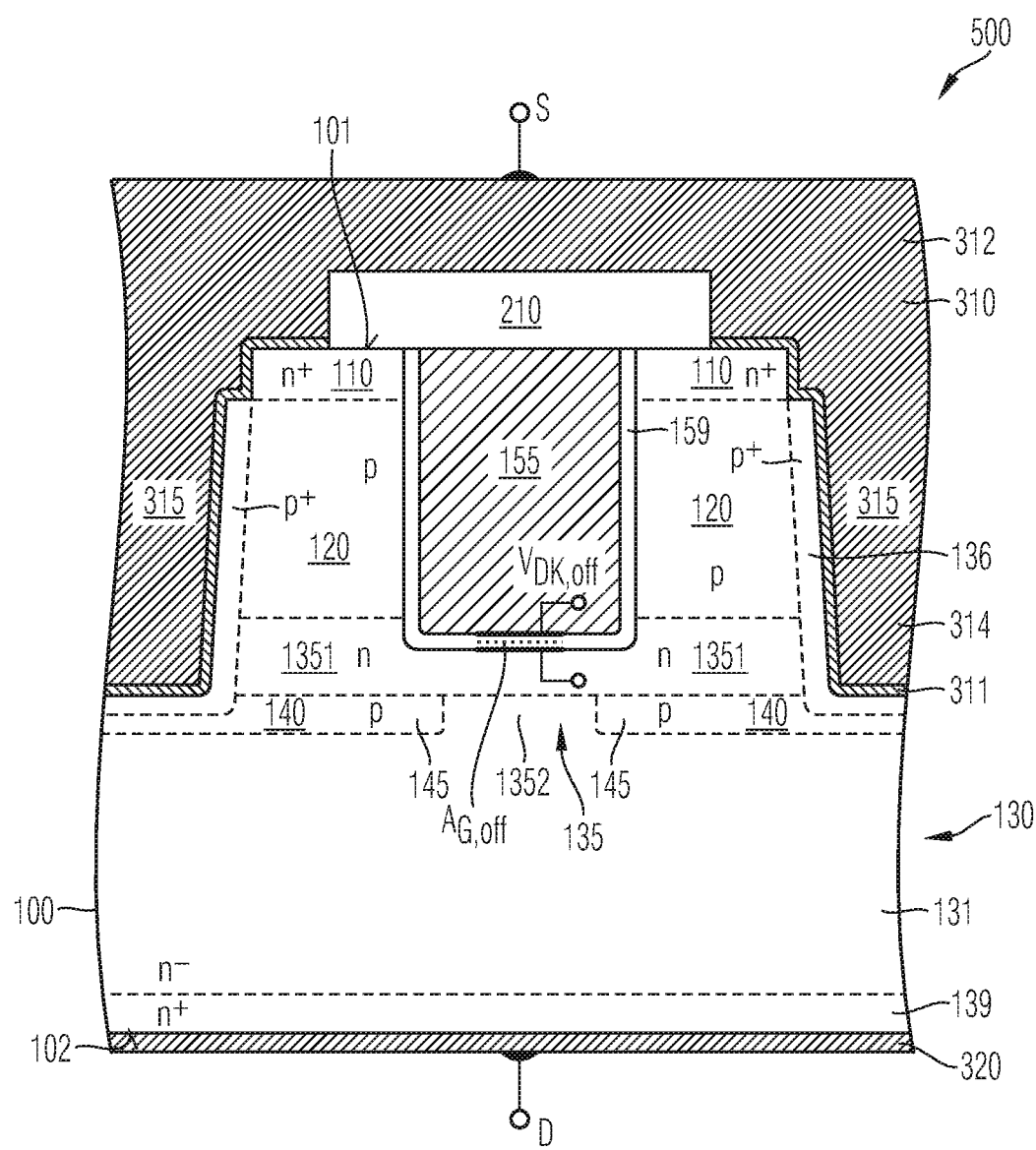
FIG. 4C is a further schematic vertical cross-sectional view of the transistor cell of FIG. 4A and illustrates a partial gate dielectric area $A_{G,off}$ across which an average voltage $V_{Dk,off}$ drops in the off state of the transistor cell.

In FIGS. 4A to 4C the semiconductor device 500 is a SiC-TMOSFET with symmetric field effect transistor cells TC and two-sided channels formed on two opposite sides of an intermediate trench gate structure 150 and with deep contact structures 315 to a diode region 140 which outermost portions are effective as shielding portions 145.

As illustrated in FIG. 4A, the longitudinal sidewalls of the trench gate structure 150 may be approximately vertical. The source regions 110 as well as the body regions 120 are symmetric with respect to a center plane of the trench gate structure 150 orthogonal to the cross-sectional plane. The deep contact structures 315 extend from the first surface 101 into mesa portions 190 of the semiconductor body 100 between neighboring trench gate structures 150. A vertical extension of the deep contact structures 315 may be greater than a vertical extension vtr of the trench gate structure 150.

A heavily p doped zone 136 may form an ohmic contact between the body regions 120 and the deep contact structures 315 as well as between the deep contact structures 315 and the diode regions 140. The heavily p doped zone 136 may further separate the connection portions 135 from the deep contact structures 315.

The deep contact structures 315 directly connect the diode regions 140 and the body regions 120 with a first load electrode 310. The deep contact structures 315 as well as the first load electrode 310 may include a contact layer 311, e.g., a metal silicide layer directly adjoining the semiconductor body 100. The first load electrode 310 may further include a metal layer portion 312 that includes, e.g., aluminum, copper or an alloy including at least one of copper and aluminum. The deep contact structures 315 may include a metal fill portion 314 from or including, e.g., the material of the metal layer portion 312. An interlayer dielectric 210 may separate the first load electrode 310 from the gate electrode 155 in the trench gate structures 150.

The shielding portions 145 of the diode regions 140 laterally extend to beyond the outer edge of the trench gate structure 150 such that they are in a vertical projection of the trench gate structure 150.

FIG. 4B shows the total effective gate dielectric area $A_{G,on}$ for the on-state, wherein $A_{G,on}$ corresponds to the complete area of the gate dielectric 159.

According to FIG. 4C, the weakly-shielded subsection giving the partial gate dielectric area $A_{G,off}$ relevant for the off-state includes only a central, flat portion of the drain-side portion 1591 and does not include subsections of the gate dielectric 159 at the corners of the trench gate structure 150.

Figure 5A:
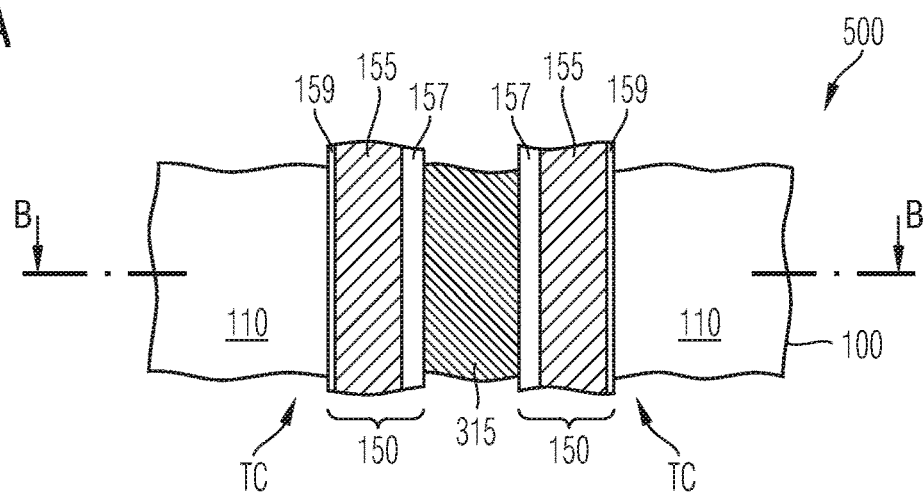
FIG. 5A is a schematic horizontal cross-sectional view of a portion of a semiconductor device including transistor cells with field effect controlled channels formed at two opposite sides of a combined trench structure including two trench gate structures and a contact structure extending between the two trench gate structures from a first surface to a diode region.
Figure 5B:
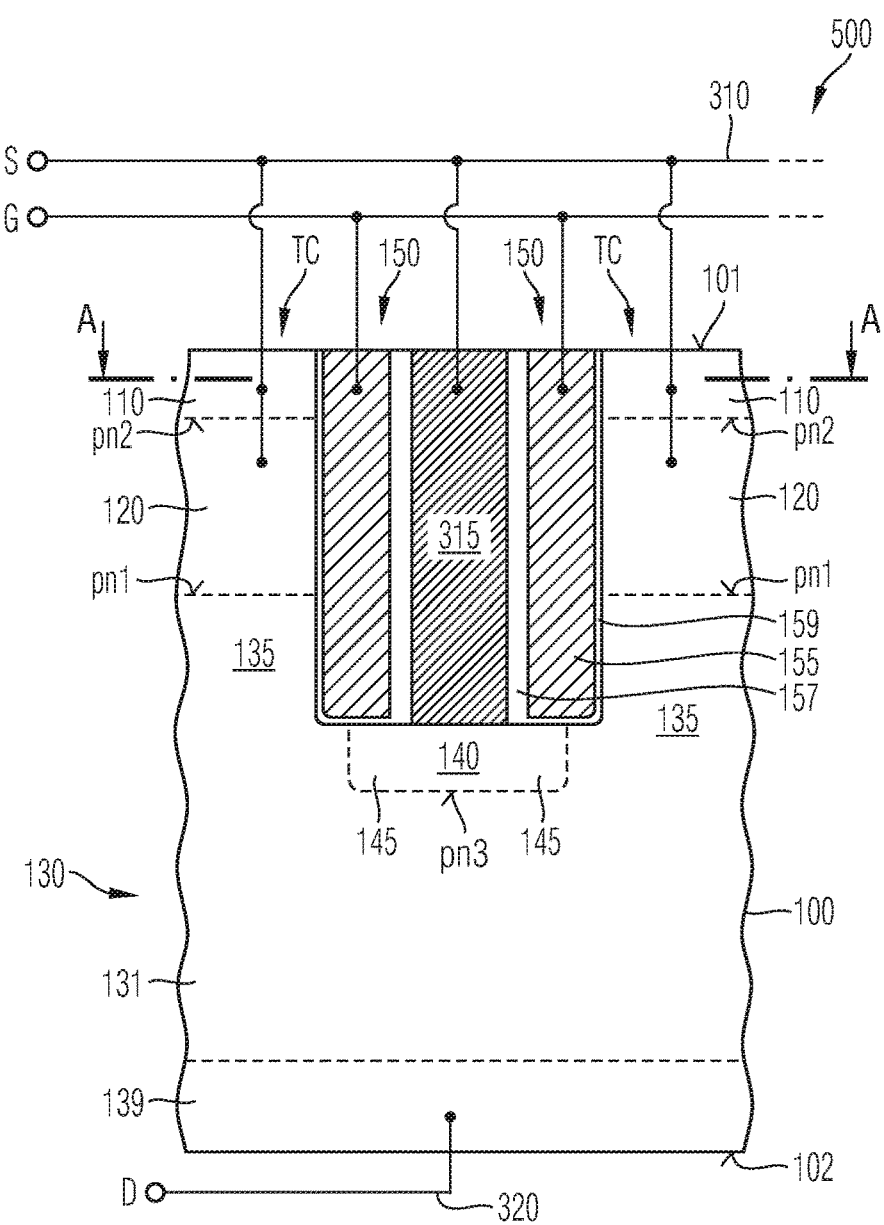
FIG. 5B is a schematic vertical cross-sectional view of the semiconductor device portion of FIG. 5A.

FIGS. 5A and 5B refer to an embodiment with a deep contact structure 315 formed between a pair of neighboring trench gate structures 150, wherein each of both trench gate structures 150 includes an active side along an active first sidewall 191 and a passive side with a separation dielectric 157 separating the deep contact structure 315 from the conductive gate electrode 155 in the trench gate structures 150. The deep contact structure 315 electrically connects the first load electrode 310 with a diode region 140 which may include shielding portions 145 in the vertical projection of the gate electrodes 155.

Figure 6A:
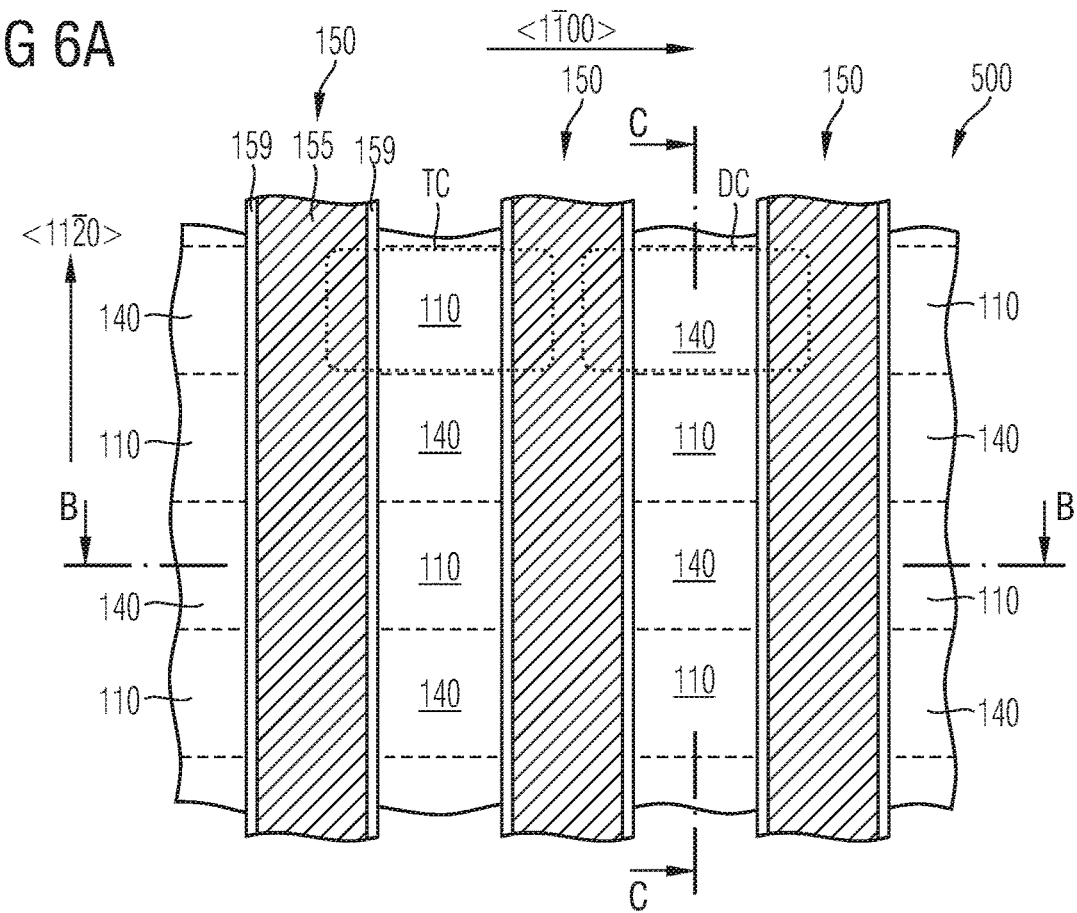
FIG. 6A is a schematic horizontal cross-sectional view of a portion of a semiconductor device based on stripe-shaped trench gate structures and with transistor cells and diode cells alternating along a direction parallel to longitudinal axes of the trench gate structures according to a further embodiment.
Figure 6B:
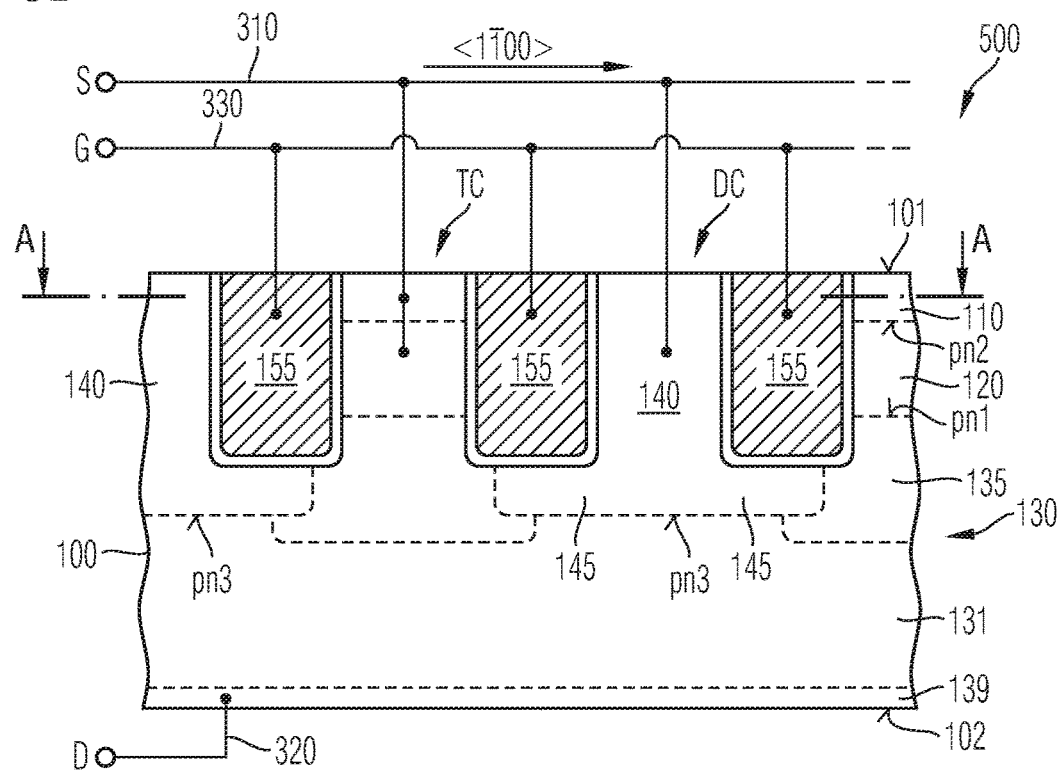
FIG. 6B a schematic vertical cross-sectional view of the semiconductor device portion of FIG. 6A along line B-B.

The semiconductor device 500 as illustrated in FIGS. 6A and 6B combines the cell concept of FIGS. 3A to 3E with stripe-shaped trench gate structures 150, which longitudinal axes may be parallel to the <11-20> crystal direction such that opposite sidewalls are (1-100) crystal planes. Along a lateral direction parallel to the longitudinal axes of the trench gate structures 150 transistor cells TC alternate with diode cells DC, wherein in the transistor cells TC the source regions 110 and the body regions 120 extend from one of two neighboring trench gate structures 150 to the other one of the neighboring trench structures 150 and wherein the diode cells DC include diode regions 140 that extend from the first surface 101 down to below the trench gate structures 150. The diode regions 140 may include shielding portions 145 which overlap with the vertical projection of both neighboring trench gate structures 150. The partial gate dielectric area $A_{G,off}$ effective for the off state is discontinuous along the longitudinal axes of the trench gate structures 150 and is interrupted by portions of the diode regions 140 formed in the diode cells DC.

Figure 7A:
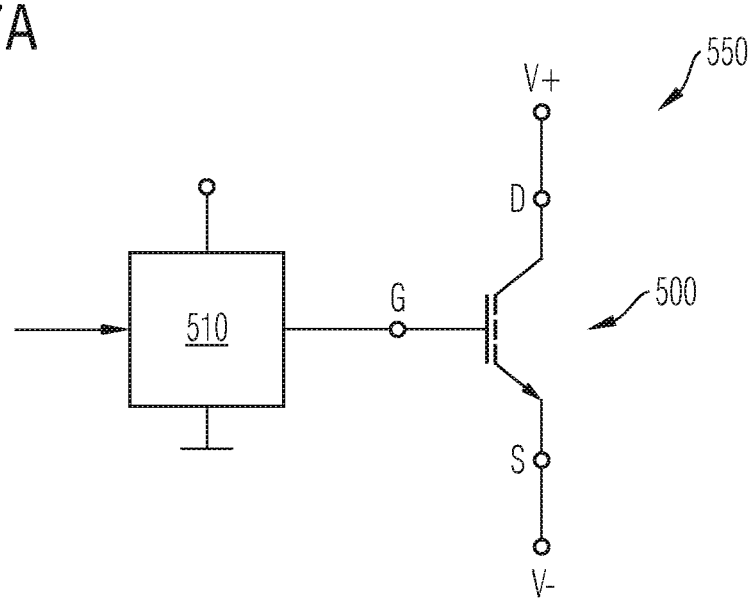
FIG. 7A is a schematic circuit diagram of an electronic circuit including a SiC-MOSFET and a gate driver circuit according to an embodiment.

FIG. 7A refers to an electronic circuit 550 including a semiconductor device 500 as described with reference to any of the preceding figures as well as a gate driver circuit 510, wherein an output O1 of the gate driver circuit 510 is electrically connected with the gate terminal G of the semiconductor device 500.

Figure 7B:
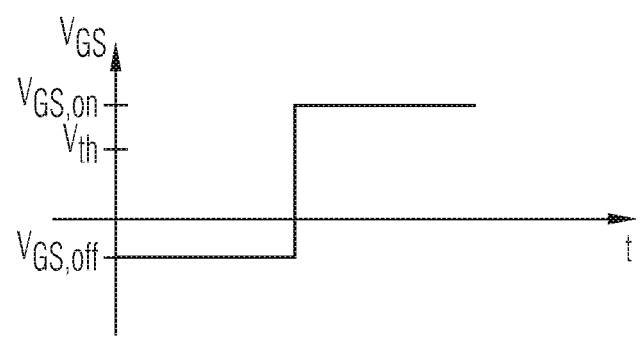
FIG. 7B is a schematic VGS time chart for the electronic circuit of FIG. 7A.

Through output O1 the gate driver circuit 510 supplies a square gate signal that may alternate between $V_{GS,off}$ and $V_{GS,on}$ as illustrated in FIG. 7B. For an n-channel semiconductor device 500 $V_{GS,off}$ is above a minimum nominal gate-to-source voltage $V_{GSmin}$ and below a minimum threshold voltage Vthmin and $V_{GS,on}$ is below a maximum nominal gate-to-source voltage $V_{GSmax}$ and above a maximum threshold voltage Vthmax. Both Vthmax and Vthmin are defined in the data sheet for the semiconductor device 500. For example, Vthmax may be about +6V and Vthmin may be about +2.7V. According to an embodiment the gate driver circuit 510 provides a $V_{GS,on}$ of about +18V and a $V_{GS,off}$ of 0V.

Figure 7C:
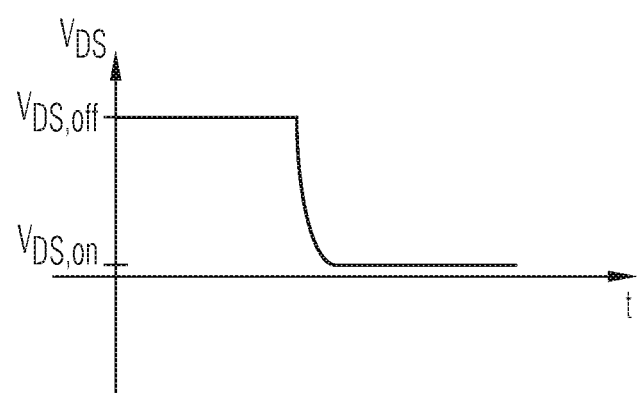
FIG. 7C is a schematic VDS time chart for the electronic circuit of FIG. 7A.

FIG. 7C shows the timing of the drain voltage for a gate signal as illustrated in FIG. 7B. In the off state the semiconductor device 500 withstands a blocking voltage $V_{DS,off}$ the semiconductor device 500 is specified for, e.g., 650V, 1000V or 1200V. When switched on, VDS drops to $V_{DS,on}$ which is less than 2V, e.g., about 1V.

Design parameters for the transistor cells are selected such that a ratio of off state FIT rate and on state FIT rate is in a range from 0.1 to 10, e.g., in a range from 0.2 to 5 for a predefined range of $V_{DS,off}$ that corresponds to a range of a maximum electric field in the drift structure from 50% to 90%, e.g., from 60% to 75% of the breakdown electric field of the semiconductor material, e.g., silicon carbide.

Figure 8:
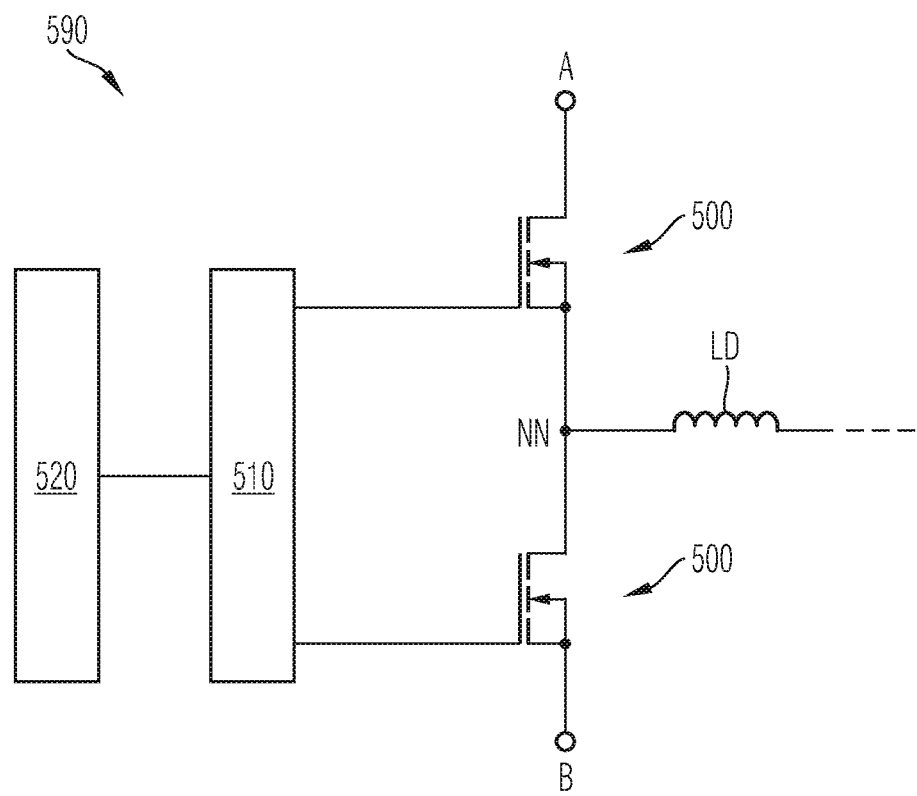
FIG. 8 is a schematic circuit diagram of an electric assembly according to an embodiment related to half-bridge circuits in switch-mode power supplies and motor drives.

FIG. 8 refers to an electric assembly 590 that may be a motor drive, a low-voltage drive, e.g., for low-speed vehicles such as forklifts, e-bikes, pedelecs, golf carts, an uninterruptable power supply with parallel semiconductor switches, a switched mode power supply, a primary stage of a switched mode power supply, a synchronous rectifier, a primary stage of a DC-to-AC converter, a secondary stage of a DC-to-AC converter, a primary stage of a DC-to-DC converter, a portion of a solar power converter, or a hard-switched or resonant telecom brick converter, charger, adapter, server power supply or telecom rectifier, by way of example.

The electric assembly 590 may include two identical semiconductor devices 500 as described above. The semiconductor devices 500 may be IGFETs and the load paths of the two semiconductor devices 500 are electrically arranged in series between a first supply terminal A and a second supply terminal B. The supply terminals A, B may supply a DC (direct-current) voltage or an AC (alternating-current) voltage. The network node NN between the two semiconductor devices 500 may be electrically connected to an inductive load, which may be a winding of a transformer or a motor winding, or to a reference potential of an electronic circuit, by way of example. The electric assembly may further include a control circuit 520 configured to supply a control signal for alternately switching on and off the semiconductor devices 500 and a gate driver circuit 510 controlled by the control circuit 520 and electrically connected to gate terminals G of the semiconductor devices 500.

The electric assembly 590 may be a motor drive with the semiconductor devices 500 electrically arranged in a half-bridge configuration, the network node NN electrically connected to a motor winding and the supply terminals A, B supplying a DC voltage.

According to another embodiment, the electric assembly 590 may be a primary side stage of a switched mode power supply with the supply terminals A, B supplying an AC voltage of an input frequency to the electric assembly 590. The network node NN is electrically connected to a primary winding of a transformer.

The electric assembly 590 may be a synchronous rectifier of a switched mode power supply with the supply terminals A, B connected to a secondary winding of the transformer and the network node NN electrically connected to a reference potential of the electronic circuit at the secondary side of the switched mode power supply.

According to a further embodiment, the electric assembly 590 may be a primary side stage of a DC-to-DC converter, e.g., a power optimizer or a micro-inverter for applications including photovoltaic cells with the supply terminals A, B supplying a DC voltage to the electric assembly 590 and the network node NN electrically connected to an inductive storage element.

According to another embodiment, the electric assembly 590 may be a secondary side stage of a DC-to-DC converter, e.g., a power optimizer or a micro-inverter for applications including photovoltaic cells, wherein the electric assembly 590 supplies an output voltage to the supply terminals A, B and wherein the network node NN is electrically connected to the inductive storage element.

According to a further embodiment both branches through which the load current is alternatively flowing are grounded. It is also possible that the load current alternatingly flows through more than two branches.

Although specific embodiments have been illustrated and described herein, it will be appreciated by those of ordinary skill in the art that a variety of alternative and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a wide band-gap semiconductor device, the method comprising:
   determining a set of design parameters for at least one of a transistor cell and a drift structure of the wide band-gap semiconductor device, by using at least one of a processor device and model transistor cells, such that
   an on-state failure-in-time rate and an off-state failure-in-time rate of a gate dielectric of the transistor cell are within a same order of magnitude for a predefined on-state gate-to-source voltage, a predefined off-state gate-to-source voltage, and a predefined off-state drain-to-source voltage.

2. The method of claim 1, further comprising:
   forming the drift structure and the transistor cell according to the set of design parameters in device regions of a wide band-gap semiconductor substrate.

3. The method of claim 2, wherein the wide band-gap semiconductor substrate is a silicon carbide substrate.

4. The method of claim 1, further comprising:
   determining the on-state failure-in-time rate based on a total gate dielectric area, in which an on-state voltage drop across the gate dielectric deviates by not more than ±1V from the on-state gate-to-source voltage.

5. The method of claim 4, further comprising:
   determining the off state failure-in-time rate based on a partial gate dielectric area and on an average voltage drop in the partial gate dielectric area in an off state, wherein the partial gate dielectric area comprises at most a drain-side portion in which the gate dielectric adjoins the drift structure.

6. The method of claim 5, wherein the partial gate dielectric area is the drain-side portion.

7. The method of claim 5, wherein the partial gate dielectric area is an area in which an absolute value of a local voltage drop across the drain-side portion is higher than an absolute value of the off-state gate-to-source voltage.

8. The method of claim 5, wherein the partial gate dielectric area is set equal to a weakly-shielded subsection of the drain-side portion, and wherein a local voltage drop across the gate dielectric in the weakly-shielded subsection is at least 90% of a maximum local voltage drop in the weakly-shielded subsection.

9. The method of claim 5, wherein the set of design parameters is determined such that the average voltage drop in the off state deviates by not more than ±2V from a sum of the on-state gate-to-source voltage and a product of 1V and a logarithm of a ratio of the total gate dielectric area and the partial gate dielectric area as follows:

$$-2V + V_{GS,on} + 1[V] \cdot \ln\left(\frac{A_{G,on}}{A_{G,off}}\right) \leq$$

$$V_{Dk,off} \leq +2V + V_{GS,on} + 1[V] \cdot \ln\left(\frac{A_{G,on}}{A_{G,off}}\right),$$

wherein $V_{GS,on}$ is the on-state gate-to-source voltage, $A_{G,on}$ is a total effective gate dielectric area across which on-state voltage $V_{Dk,on}$ drops in the on state of the transistor cell, and $A_{G,off}$ is a partial gate dielectric area across which an average off-state voltage $V_{Dk,off}$ drops in the off state of the transistor cell.

10. The method of claim 5, wherein the set of design parameters is determined such that the average voltage drop in the off state deviates by not more than ±2V from a sum of the on state gate-to-source voltage and a product of 1V and a logarithm of a product of a ratio of the total gate dielectric area and the partial gate dielectric area and a ratio of an estimated total on-state time of the semiconductor device to an estimated total off-state time of the semiconductor device as follows $$-2V + V_{GS,on} + 1[V] \cdot \ln\left(\frac{A_{G,on} \cdot t_{on}}{A_{G,off} \cdot t_{off}}\right) \leq$$

$$V_{Dk,off} \leq +2V + V_{GS,on} + 1[V] \cdot \ln\left(\frac{A_{G,on} \cdot t_{on}}{A_{G,off} \cdot t_{off}}\right),$$

wherein $V_{GS,on}$ is the on-state gate-to-source voltage, $A_{G,on}$ is a total effective gate dielectric area across which on-state voltage $V_{Dk,on}$ drops in the on state of the transistor cell, and $A_{G,off}$ is a partial gate dielectric area across which an average off-state voltage $V_{Dk,off}$ drops in the off state of the transistor cell.

11. The method of claim 1, wherein the drift structure comprises a drift zone and a connection portion adjoining the drift zone and adjoining a gate structure comprising the gate dielectric, and wherein the design parameters comprise one or more of a first vertical extension of the connection portion, a net doping in the connection portion, a lateral extension of the connection portion, a lateral distance between an edge of the connection portion and a center axis of the gate structure, a vertical extension of the drift zone, a net drift zone doping, and a thickness and a composition of the gate dielectric.

12. The method of claim 11, wherein the gate structure is a trench gate structure extending from a first surface into a semiconductor body that comprises the drift structure, and wherein the design parameters comprise at least one of a distance between the first surface and the connection portion, a vertical extension of the gate structure, a first thickness of the gate dielectric along sidewalls of the gate structure, a second thickness of the gate dielectric along a bottom of the gate structure and an inner radius of a curvature between a sidewall and the bottom of the gate structure in a region directly adjoining to the connection portion.

13. A semiconductor device, comprising:
a gate structure comprising a gate dielectric separating a gate electrode from a semiconductor body; and
a drift structure comprising a drift zone and a connection portion that adjoins a drain-side portion of the gate dielectric,
wherein design parameters of the connection portion, the drift zone, the gate structure and the gate dielectric are selected such that an on-state failure-in-time rate of the gate dielectric and an off-state failure-in-time rate of the gate dielectric are within a same order of magnitude.

14. The semiconductor device of claim 13, wherein the on-state failure-in-time rate depends on a total gate dielectric area, in which an on state voltage drop across the gate dielectric deviates by not more than ±1V from an on state gate-to-source voltage, and wherein the off-state failure-in-time rate depends on a partial gate dielectric area and an average voltage drop in the partial gate dielectric area in an off state, and wherein the partial gate dielectric area comprises at most the drain-side portion.

15. The semiconductor device of claim 14, wherein the design parameters of the connection portion, the drift zone, the gate structure and the gate dielectric are selected such that the average state voltage drop in the drain-side portion in the off state deviates by not more than ±2V from a sum of the on state gate-to-source voltage and a product of 1V and a logarithm of a ratio of the total gate dielectric area and the partial gate dielectric area according to $$-2V + V_{GS,on} + 1[V] \cdot \ln\left(\frac{A_{G,on}}{A_{G,off}}\right) \leq$$

$$V_{Dk,off} \leq +2V + V_{GS,on} + 1[V] \cdot \ln\left(\frac{A_{G,on}}{A_{G,off}}\right),$$

wherein $V_{GS,on}$ is the on-state gate-to-source voltage, $A_{G,on}$ is a total effective gate dielectric area across which on-state voltage $V_{Dk,on}$ drops in the on state of the transistor cell, and $A_{G,off}$ is a partial gate dielectric area across which an average off-state voltage $V_{Dk,off}$ drops in the off state of the transistor cell.

16. The semiconductor device of claim 13, wherein the semiconductor body is from silicon carbide.

17. The semiconductor device of claim 13, wherein the gate structure is a trench gate structure extending from a first surface into the semiconductor body.

18. The semiconductor device of claim 17, further comprising:
a body region forming a first pn junction with the connection portion and a second pn junction with a source region formed in a mesa portion of the semiconductor body along an active sidewall parallel to a main crystal plane of the semiconductor body.

19. The semiconductor device of claim 17, further comprising:
a shielding portion forming a pn junction with the connection portion, wherein a vertical projection of the shielding portion overlaps with the gate structure.

20. The semiconductor device of claim 19, further comprising:
a diode region forming a pn junction with the drift structure, wherein the diode region extends from the first surface into the semiconductor body and comprises the shielding portion.

21. The semiconductor device of claim 20, wherein the diode region adjoins a sidewall of the gate structure.

22. The semiconductor device of claim 19, further comprising:
a deep contact structure extending from the first surface into the semiconductor body and directly adjoining the shielding portion.

23. The semiconductor device of claim 13, wherein design parameters are selected such that the ratio of the on-state failure-in-time rate and the off-state failure-in-time rate are within the same order of magnitude for a predefined range of an off-state drain-to-source voltage that corresponds to a range of a maximum electric field in the drift structure from 50% to 90% of a breakdown electric field of a semiconductor material of the semiconductor body.

24. An electronic circuit, comprising:
  a gate driver circuit configured to output a gate signal with an on-state gate-to-source voltage and an off-state gate-to-source voltage at an output terminal; and
  a semiconductor device that comprises a gate terminal electrically coupled to the output terminal, and a gate structure comprising a gate dielectric separating a gate electrode from a semiconductor body, the gate electrode being electrically connected to the gate terminal; and
  a drift structure comprising a drift zone and a connection portion that directly adjoins to a drain-side portion of the gate dielectric,
  wherein design parameters of the connection portion, the drift zone, the gate structure and the gate dielectric are selected such that an on state failure-in-time rate of the gate dielectric and an off state failure-in-time rate of the gate dielectric are within a same order of magnitude.

25. The electronic circuit of claim 24, wherein the design parameters of the connection portion, the drift zone, the gate structure and the gate dielectric are selected such that an average off-state voltage drop in the drain-side portion deviates by not more than ±2V from a sum of a gate-to-source voltage applied in the on state and a product of 1V and a logarithm of a ratio of a total gate dielectric area and a partial gate dielectric area according to $$-2V + V_{GS,on} + 1[V] \cdot \ln\left(\frac{A_{G,on}}{A_{G,off}}\right) \leq$$
$$V_{Dk,off} \leq +2V + V_{GS,on} + 1[V] \cdot \ln\left(\frac{A_{G,on}}{A_{G,off}}\right),$$

wherein $V_{GS,on}$ is the on-state gate-to-source voltage, $A_{G,on}$ is a total effective gate dielectric area across which on-state voltage $V_{Dk,on}$ drops in the on state of the transistor cell, and $A_{G,off}$ is a partial gate dielectric area across which an average off-state voltage $V_{Dk,off}$ drops in the off state of the transistor cell.

26. A method of designing a semiconductor device, the method comprising:
  determining, by using at least one of a processor device and model transistor cells, a set of design parameters for a transistor cell and a drift structure,
  wherein an on state failure-in-time rate and an off state failure-in-time rate of a gate dielectric of the transistor cell are within a same order of magnitude for a predefined on-state gate-to-source voltage, a predefined off-state gate-to-source voltage, and a predefined off-state drain-to-source voltage.

* * * * *